(12) United States Patent
Binnard

(10) Patent No.: US 10,712,671 B2
(45) Date of Patent: Jul. 14, 2020

(54) DENSE LINE EXTREME ULTRAVIOLET LITHOGRAPHY SYSTEM WITH DISTORTION MATCHING

(71) Applicant: NIKON CORPORATION, Tokyo (JP)

(72) Inventor: Michael B. Binnard, Belmont, CA (US)

(73) Assignee: NIKON CORPORATION (JP)

( * ) Notice: Subject to any disclaimer, the term of this patent is extended or adjusted under 35 U.S.C. 154(b) by 0 days.

(21) Appl. No.: 16/307,892

(22) PCT Filed: Jun. 15, 2017

(86) PCT No.: PCT/US2017/037786
§ 371 (c)(1),
(2) Date: Dec. 6, 2018

(87) PCT Pub. No.: WO2017/222919
PCT Pub. Date: Dec. 28, 2017

(65) Prior Publication Data
US 2019/0212663 A1    Jul. 11, 2019

Related U.S. Application Data

(63) Continuation-in-part of application No. 15/599,197, filed on May 18, 2017, and a continuation-in-part of application No. 15/599,148, filed on May 18, 2017.
(Continued)

(51) Int. Cl.
*G03F 7/20* (2006.01)

(52) U.S. Cl.
CPC ...... *G03F 7/70466* (2013.01); *G03F 7/70358* (2013.01); *G03F 7/70366* (2013.01); *G03F 7/70633* (2013.01); *G03F 7/70725* (2013.01)

(58) Field of Classification Search
CPC ............. G03F 7/70283; G03F 7/70466; G03F 7/70366
(Continued)

(56) References Cited

U.S. PATENT DOCUMENTS 3,884,573 A    5/1975    Franklin
4,924,257 A    5/1990    Jain
(Continued)

FOREIGN PATENT DOCUMENTS

WO    WO2009083229 A1    7/2009
WO    WO2012177663 A3    12/2012

OTHER PUBLICATIONS

H.H. Solak, "Sub-50mm period patterns with EUV interference lithography", Microselectronic Enginnering 67-68, (2003).
(Continued)

*Primary Examiner* — Hung Nguyen
(74) *Attorney, Agent, or Firm* — Roeder & Broder LLP; Steven D. Roeder

(57) ABSTRACT

An extreme ultraviolet lithography system (10) that creates a new pattern (330) having a plurality of densely packed parallel lines (332) on a workpiece (22), the system (10) includes a patterning element (16); an EUV illumination system (12) that directs an extreme ultraviolet beam (13B) at the patterning element (16); a projection optical assembly (18) that directs the extreme ultraviolet beam diffracted off of the patterning element (16) at the workpiece (22) to create a first stripe (364) of generally parallel lines (332) during a first scan (365); and a control system (24). The workpiece (22) includes an existing pattern (233) that is distorted. The control system (24) selectively adjusts a control parameter during the first scan (365) so that the first stripe (364) is distorted to more accurately overlay the portion of existing pattern (233) positioned under the first stripe (364).

23 Claims, 14 Drawing Sheets

Related U.S. Application Data

(60) Provisional application No. 62/504,908, filed on May 11, 2017, provisional application No. 62/490,313, filed on Apr. 26, 2017, provisional application No. 62/487,245, filed on Apr. 19, 2017, provisional application No. 62/476,476, filed on Mar. 24, 2017, provisional application No. 62/353,245, filed on Jun. 22, 2016, provisional application No. 62/352,545, filed on Jun. 20, 2016, provisional application No. 62/338,893, filed on May 19, 2016.

(58) Field of Classification Search
USPC .............................................. 355/53, 67–71
See application file for complete search history.

(56) References Cited

U.S. PATENT DOCUMENTS

| | | | |
|---|---|---|---|
| 5,144,363 A | 9/1992 | Wittekoek et al. | |
| 5,477,304 A * | 12/1995 | Nishi | G03F 7/70358 355/50 |
| 5,579,147 A | 11/1996 | Mori et al. | |
| 5,614,988 A | 3/1997 | Kato et al. | |
| 5,623,853 A | 4/1997 | Novak et al. | |
| 5,668,672 A | 9/1997 | Oomura | |
| 5,689,377 A | 11/1997 | Takahashi | |
| 5,739,899 A | 4/1998 | Nishi et al. | |
| 5,835,275 A | 11/1998 | Takahashi et al. | |
| 5,854,671 A | 12/1998 | Nishi | |
| 5,874,820 A | 2/1999 | Lee | |
| 5,892,117 A | 4/1999 | Theriot | |
| 6,014,421 A | 1/2000 | Chiba | |
| 6,225,027 B1 | 5/2001 | Replogle et al. | |
| 6,331,710 B1 | 12/2001 | Wang et al. | |
| 6,512,573 B2 | 1/2003 | Furter | |
| 6,560,044 B2 * | 5/2003 | Shinoda | G02B 27/18 355/53 |
| 7,068,350 B2 | 6/2006 | Nishi et al. | |
| 7,671,970 B2 | 3/2010 | Loopstra | |
| 8,133,661 B2 * | 3/2012 | Chang | G03F 7/70283 430/312 |
| 8,223,345 B2 | 7/2012 | Hidaka et al. | |
| 8,411,249 B2 | 4/2013 | Hidaka | |
| 8,502,978 B2 | 8/2013 | Hidaka | |
| 8,599,387 B2 | 12/2013 | Hidaka | |
| 8,623,588 B2 | 1/2014 | Sewell | |
| 8,705,170 B2 | 4/2014 | Williamson et al. | |
| 2002/0093636 A1 | 7/2002 | Komatsuda | |
| 2004/0165169 A1 | 8/2004 | Antonius et al. | |
| 2005/0024610 A1 | 2/2005 | Nishi | |
| 2007/0013894 A1 | 1/2007 | Loopstra | |
| 2008/0128642 A1 | 6/2008 | Mos | |
| 2008/0151211 A1 | 6/2008 | Kaiser et al. | |
| 2009/0257042 A1 | 10/2009 | Komatsuda | |
| 2009/0268182 A1 | 10/2009 | Staals et al. | |
| 2010/0053584 A1 | 3/2010 | Kajiyama et al. | |
| 2011/0013162 A1 | 1/2011 | Kiuchi et al. | |
| 2011/0071784 A1 | 3/2011 | Smith et al. | |
| 2012/0008150 A1 | 1/2012 | Smith et al. | |
| 2012/0287414 A1 | 11/2012 | Fioika | |
| 2013/0188084 A1 | 7/2013 | Goodwin | |
| 2013/0308140 A1 | 11/2013 | Goodwin et al. | |
| 2013/0330662 A1 | 12/2013 | Goodwin | |
| 2014/0023973 A1 | 1/2014 | Marconi et al. | |
| 2014/0049761 A1 | 2/2014 | Goodwin | |
| 2014/0233011 A1 | 8/2014 | Goodwin et al. | |
| 2014/0253892 A1 | 9/2014 | Yu et al. | |
| 2015/0042975 A1 | 2/2015 | Hetzler | |
| 2015/0049321 A1 | 2/2015 | Bieling et al. | |
| 2016/0033866 A1 | 2/2016 | Lu et al. | |
| 2017/0336716 A1 * | 11/2017 | Flagello | G03F 7/70033 |

OTHER PUBLICATIONS

International Search Report and Written Opinion of the International Search Authority for PCT/USl7/37786, Nikon Corporation, Aug. 31, 2017 (related matter).

Extended European Search Report from the European Patent Office, for EPO Application No. 17815964.6, Nikon Corporation, dated Feb. 3, 2020.

* cited by examiner

DENSE LINE EXTREME ULTRAVIOLET LITHOGRAPHY SYSTEM WITH DISTORTION MATCHING

CROSS-REFERENCE TO RELATED APPLICATIONS

The present application claims priority from each and every one of the following U.S. Provisional patent application Ser. No. 62/352,545 filed on Jun. 20, 2016 and titled "Dense Line Extreme Ultraviolet Lithography System with Distortion Matching"; Ser. No. 62/353,245 filed on Jun. 22, 2016 and titled "Extreme Ultraviolet Lithography System that Utilizes Pattern Stitching"; and Ser. No. 62/504,908 filed on May 11, 2017 and titled "Illumination System with Curved 1D-Patterned Mask for Use in EUV-Exposure Tool". As far as permitted, the contents of U.S. Provisional patent application Ser. No. 62/352,545, Ser. No. 62/353,245, and Ser. No. 62/504,908 are each incorporated by reference herein for all purposes.

The present application also claims priority on U.S. patent application Ser. No. 15/599,148, filed on May 18, 2017, and titled "EUV Lithography System for Dense Line Patterning". Further, the present application also claims priority on U.S. patent application Ser. No. 15/599,197, filed on May 18, 2017, and titled "EUV Lithography System for Dense Line Patterning". As far as permitted, the contents of U.S. patent application Ser. No. 15/599,148, and U.S. patent application Ser. No. 15/599,197 are each incorporated by reference herein for all purposes.

As far as permitted, the contents of U.S. Provisional patent application Ser. No. 62/338,893 filed on May 19, 2016 and titled "EUV Lithography System for Dense Line Patterning"; Ser. No. 62/487,245 filed on Apr. 19, 2017 and titled "Optical Objective for Dense Line Patterning in EUV Spectral Region"; and Ser. No. 62/490,313 filed on Apr. 26, 2017 and titled "Illumination System With Flat 1D-Patterned Mask for Use in EUV-Exposure Tool" are each incorporated by reference herein for all purposes.

TECHNICAL FIELD

The present invention relates to exposure tools used in lithographic processing of semiconductor workpieces, and more particularly, to an exposure tool configured to form, on a workpiece, a pattern of parallel lines that are separated from one another by a few tens of nanometers or less.

BACKGROUND

Lithography systems are commonly used to transfer images from a patterning element onto a workpiece during exposure. Next generation lithography technology may use extreme ultraviolet (EUV) lithography to enable semiconductor workpieces with extremely small feature sizes to be fabricated.

SUMMARY

One embodiment is directed to an extreme ultraviolet lithography system that creates a new pattern having a plurality of densely packed parallel lines on a workpiece (e.g., a semiconductor wafer) that includes an existing pattern that is distorted. The lithography system includes a patterning element having a patterning element pattern; a workpiece stage mover assembly that retains and moves the workpiece relative to the patterning element; an EUV illumination system that directs an extreme ultraviolet beam (e.g., light with a wavelength of approximately 13.5 nm) at the patterning element; a projection optical assembly that directs the extreme ultraviolet beam diffracted off of the patterning element at the workpiece to create a first stripe of densely packed parallel lines on the workpiece that extend generally along a first axis; and a control system that controls the stage assembly to move the workpiece relative to the exposure field along a first scan trajectory that is generally parallel to the first axis during the first scan. As provided herein, the control system selectively adjusts a control parameter during the first scan so that the first stripe of parallel lines more accurately overlays the portion of existing pattern positioned under the first stripe of parallel lines relative to if the control parameter is not adjusted.

In one embodiment, the control parameter includes selectively adjusting the first scan trajectory to include some movement along a second axis that is orthogonal to the first axis, and some movement about a third axis that is orthogonal to the first and second axes during the first scan so that the first stripe of parallel lines more accurately overlays the portion of existing pattern positioned under the first stripe of parallel lines. During the first scan, the movement along the second axis and about the third axis is a function of a workpiece position of the stage along the first axis.

Additionally or alternatively, the control parameter can include selectively adjusting a magnification of the patterning element pattern image during the first scan so that the first stripe of parallel lines more accurately overlays the portion of existing pattern positioned under the first stripe of parallel lines. Further, the control parameter can include selectively adjusting a magnification tilt (i.e., a linear variation in magnification across the exposure field) of the patterning element pattern image during the first scan so that the first stripe of parallel lines more properly overlays the portion of existing pattern positioned under the first stripe of parallel lines.

In one embodiment, the existing pattern includes a plurality of previously patterned dies (also called exposure "shots" or "fields," as each shot may contain more than one pattern or semiconductor device), and the control system controls the EUV illumination system so that every other die along the first scan trajectory is not exposed during the first scan. Subsequently, the control system can control the EUV illumination system to expose the unexposed dies along the first scan trajectory during a second scan.

In another embodiment, the control system controls the EUV illumination system to stop the first scan at an interface of adjacent dies and reset the first scan trajectory.

As provided herein, the control system can selectively adjust the first scan trajectory and a pitch of the parallel lines transferred to the workpiece during the first scan so that the first stripe of parallel lines are distorted to more accurately overlay the portion of existing pattern positioned under the first stripe of parallel lines.

Yet another embodiment is directed to a method for transferring a new pattern having a plurality of densely packed lines onto a workpiece that includes an existing pattern that is distorted. The method can include (i) providing a patterning element having a patterning element pattern; (ii) moving the workpiece with a workpiece stage mover assembly; directing an extreme ultraviolet beam at the patterning element with an EUV illumination system; (iii) directing the extreme ultraviolet beam diffracted off of the patterning element at the workpiece with a projection optical assembly to create the plurality of densely packed parallel lines on the workpiece when the workpiece is moved relative to the exposure field during a first scan, the first stripe of parallel lines extending generally along a first axis; and (iv) controlling the stage assembly with a control system to move the workpiece relative to the exposure field along a first scan trajectory that is generally parallel to the first axis during the first scan; the control system including a processor; wherein the control system selectively adjusts a control parameter during the first scan so that the first stripe of parallel lines more accurately overlays the portion of existing pattern positioned under the first stripe of parallel lines.

An embodiment is also directed to a device manufactured with the lithography system, and/or a workpiece (e.g., a semiconductor wafer) on which an image has been formed by the lithography system.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
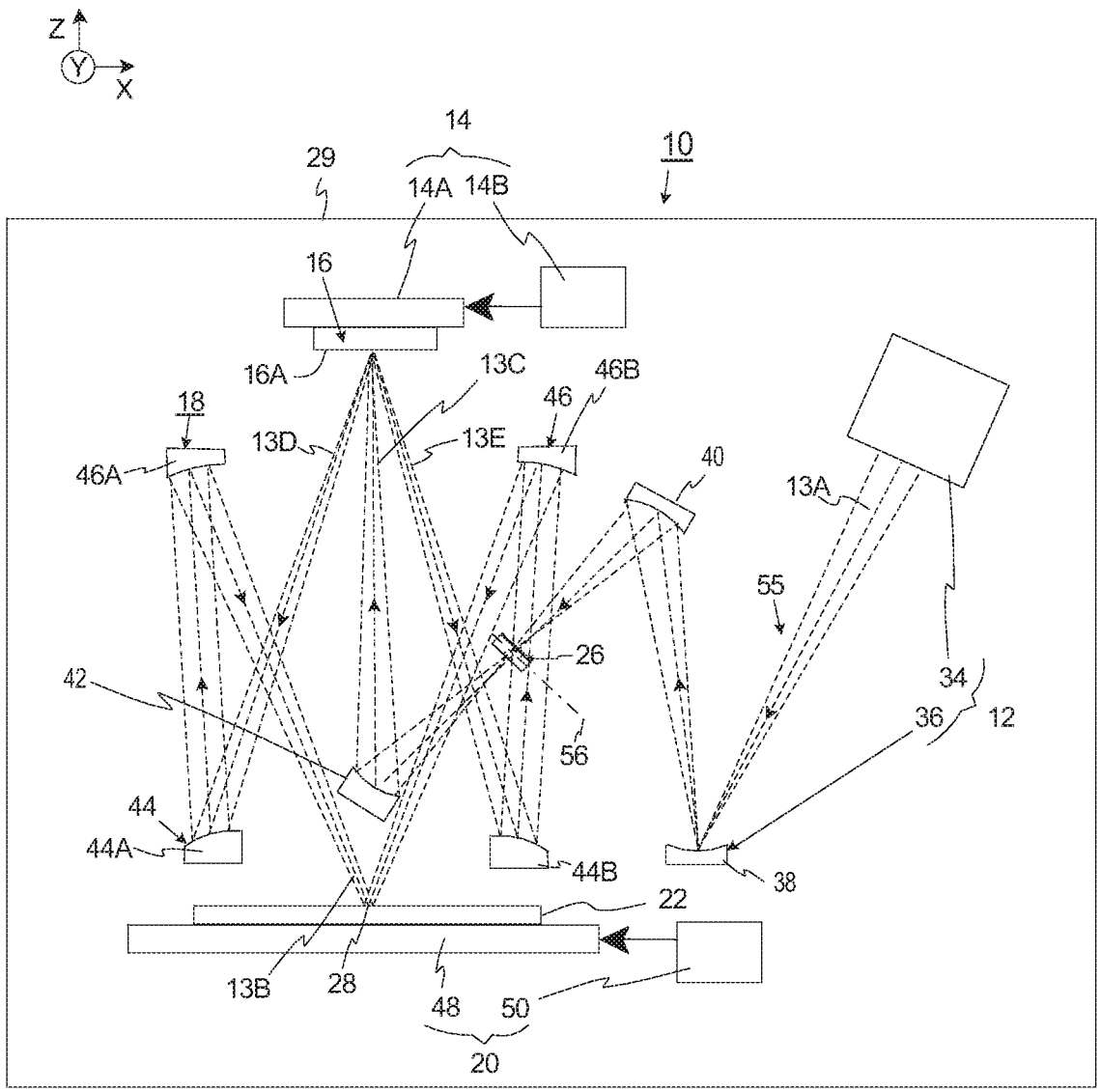
FIG. 1A is a simplified, schematic view illustrating an extreme ultraviolet lithography system having features of the present embodiment.

FIG. 1A is a simplified, non-exclusive, schematic view illustrating an extreme ultraviolet (EUV) lithography system 10 that includes an EUV illumination system 12 (irradiation apparatus) that generates an initial EUV beam 13A (illustrated with dashed lines), a patterning element stage assembly 14 that retains a patterning element 16 having a patterning element pattern 16A, a projection optical assembly 18, a workpiece stage assembly 20 that retains and positions a workpiece 22, which can be a semiconductor wafer, a control system 24 that controls the operation of the components of the system 10, and a shutter assembly 26 that defines the shape of an exposure field 28 on the workpiece 22 created with a shaped and diffracted EUV beam 13D, 13E. The design and location of these components can be varied pursuant to the teachings provided herein.

Additionally, it should be noted that the EUV lithography system 10 will typically include more components than illustrated in FIG. 1A. For example, the EUV lithography system 10 can include a rigid apparatus frame (not shown) for retaining one or more of the components of the system. Moreover, the EUV lithography system 10 can include one or more temperature control systems (not shown) that control the temperature of one or more of the components of the EUV lithography system 10. For example, the EUV illumination system 12, the patterning element 16, the projection optical assembly 18, and/or the workpiece stage assembly 20 can require cooling with a temperature control system.

Additionally, for example, the EUV system 10 can include an enclosed chamber 29 that allows for many of the components of the EUV lithography system 10 to operate in a controlled environment, such as a vacuum.

Figure 2A:
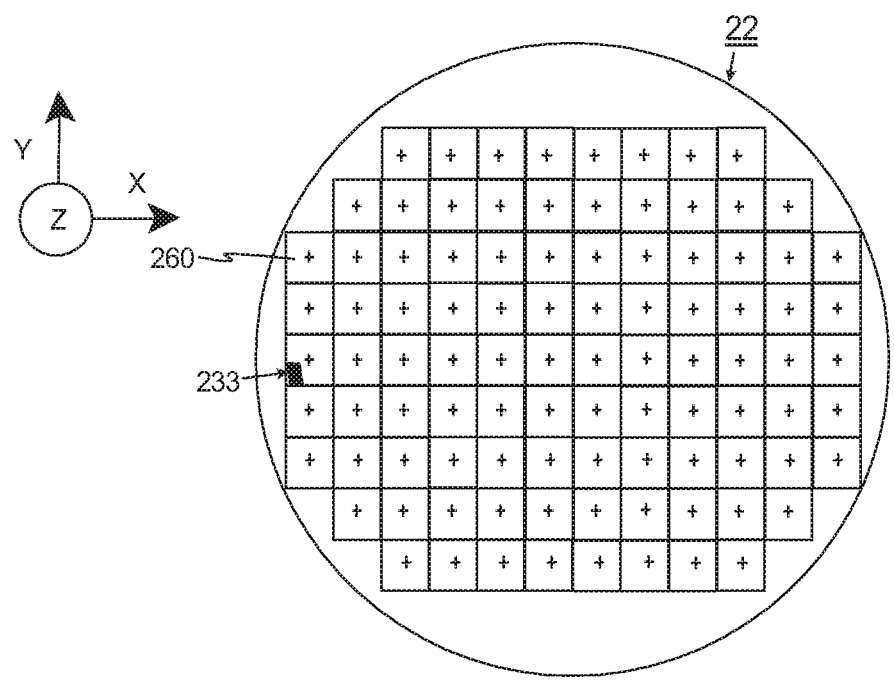
FIG. 2A is a simplified top view of a workpiece that has been processed to include an existing pattern.

As an overview, the EUV lithography system 10 directs the exposure field 28 onto the workpiece 22 that is being moved along a scan trajectory to transfer a new pattern 330 (illustrated in FIG. 3B) that only includes a plurality of densely packed, generally parallel lines 332 onto the semiconductor workpiece 22 which already includes an existing pattern 233 (illustrated in FIG. 2A). In certain embodiments, the EUV lithography system 10 adjusts one or more control parameters, such as the scan trajectory of the workpiece 22, a magnification of the image of patterning element pattern 16A, and/or a magnification tilt of image of the patterning element pattern 16A while scanning and exposing the workpiece 22 so that the new pattern 233 follows and more closely overlays the existing pattern 233 than if one or more of the control parameter was not adjusted. Thus, in one embodiment, present embodiment creates an imperfect new pattern 330 of densely packed, generally parallel lines to better match and better overlay the distorted existing pattern 233. Further, in certain embodiments, the EUV lithography system 10 can be controlled to create discontinuities between adjacent dies along the scan trajectory. More specifically, the EUV lithography system 10 can be controlled to scan every stripe of parallel lines on the workpiece 22 twice, exposing every other die in the first pass, and the alternate dies in the second pass.

In summary, the EUV lithography system 10 is uniquely designed to more accurately match and overlay a new pattern 330 of lines to a distorted existing pattern 233 on the workpiece 22 by adjusting the scan trajectory, magnification, and "magnification tilt" of the patterning element pattern 16A while scanning and exposing the workpiece 22.

Because of workpiece distortion and the characteristics of how the layers of the existing pattern 233 were created, the existing pattern is typically distorted. With the present embodiment, the new patterning element pattern 330 is printed to be distorted in a more closely matching fashion.

Some of the Figures provided herein include an orientation system that designates the X axis, the Y axis, and a Z axis that are orthogonal to each other. In these Figures, the Z axis is oriented in the vertical direction. It should be understood that the orientation system is merely for reference and can be varied. For example, the X axis can be switched with the Y axis and/or the EUV lithography system 10 can be rotated. Moreover, these axes can alternatively be referred to as the first, the second, or a third axis. For example, the Y axis can be referred to as the first axis, the X axis can be referred to as the second axis, and the Z axis can be referred to as the third axis.

The EUV illumination system 12 includes an EUV illumination source 34 and an illumination optical assembly 36. The EUV illumination source 34 emits the initial EUV beam 13A and the illumination optical assembly 36 directs and conditions the EUV beam 13A from the illumination source 34 to provide an adjusted EUV beam 13C that is directed at the patterning element 16. In FIG. 1A, the EUV illumination system 12 includes a single EUV illumination source 34 and a single illumination optical assembly 36. Alternatively, the EUV illumination system 12 could be designed to include a multiple EUV illumination sources 34 and multiple illumination optical assemblies 36.

As provided herein, the EUV illumination source 34 emits the EUV beam 13A that is within the EUV spectral range. As provided herein, the "EUV spectral range" shall mean and include wavelengths between approximately five and fifteen nanometers, and preferably within a narrow band around 13.5 nanometers. As a non-exclusive example, the EUV illumination source 34 can be a plasma system, such as either a Laser Produced Plasma (LPP) or a Discharge Produced Plasma (DPP).

The illumination optical assembly 36 is reflective, and includes one or more optical elements that are operable in the EUV spectral range. More specifically, each optical element includes a working surface that is coated to reflect light in the EUV spectral range. Further, the optical elements are spaced apart from each other.

In FIG. 1A, the illumination optical assembly 36 includes a first illumination optical element 38, a second illumination optical element 40, and a third illumination optical element 42 that cooperate to condition the initial EUV beam 13A and direct the conditioned EUV beam 13C at the patterning element 16. In one embodiment, the first illumination optical element 38 is a fly's eye type reflector that includes a plurality of individual, micro-reflectors (micro-mirrors or facets) that are arranged in a two dimensional array, with each reflector including a working surface that is coated to reflect light in the EUV spectral range. Similarly, the second illumination optical element 40 is a fly's eye type reflector that includes a plurality of individual, micro-reflectors (micro-mirrors or facets) that are arranged in a two dimensional array, with each reflector including a working surface that is coated to reflect light in the EUV spectral range. Further, the third illumination optical element 42 is a reflector that includes a working surface that is coated to reflect light in the EUV spectral range. In certain embodiments, the illumination optical elements 38, 40, 42 comprise curved surfaces for focusing the EUV light.

In FIG. 1A, the EUV illumination source 34 emits the initial EUV beam 13A generally downward at the first illumination optical element 38. The plurality of micro-reflectors of the first illumination optical element 38 reflect and redirect the EUV beam generally upward at the second illumination optical element 40. Somewhat similarly, the plurality of micro-reflectors of the second illumination optical element 40 reflect and redirect the EUV beam generally downward at the third illumination optical element 42. Next, the third illumination optical element 42 acts as a relay that collects, reflects, and uniformly focuses the conditioned EUV beam 13C generally upward onto a patterning element surface 16A of the patterning element 16. It should be noted that the faceted mirror surfaces of the first illumination optical element 38 form images of the EUV illumination source 34 at each of the faceted mirror surfaces of the second illumination optical element 40. In response, the faceted mirror surfaces of the second illumination optical element 40 reflect a uniform image of the first illumination optical element 38 via the third illumination optical element 42 onto the patterning element 16. In the embodiment shown, an intermediate image of the first illumination optical element 38 is formed at intermediate image plane 56 between illumination optical element 40 and illumination optical element 42. Stated in another fashion, each facet of the second illumination optical element 40 is optically conjugate to the EUV source 34 and the third illumination element 42, while each facet of first illumination optical element 38 is optically conjugate to the intermediate image plane 56 and the patterning element 16. With this arrangement, the image field of each reflector surface of the first illumination optical element 38 overlaps at the patterning element 16 to form a sufficiently uniform irradiance pattern on the patterning element 16.

The patterning element stage assembly 14 holds the patterning element 16. In certain embodiments, the patterning element stage assembly 14 can be designed to make slight adjustments to the position and/or shape of the patterning element 16 to improve the imaging performance of the EUV lithography system 10. For example, in certain embodiments, the patterning element stage assembly 14 can shape, position and/or move the patterning element 16 to make changes and adjustments to a magnification of the exposure field 28, and changes to a magnification tilt of the exposure field 28. In one non-exclusive example, the patterning element stage assembly 14 can include a patterning element stage 14A, and a patterning element stage mover 14B. In the non-exclusive embodiment illustrated in FIG. 1A, the patterning element stage 14A is monolithic and includes a patterning element holder (not shown) that retains the patterning element 16. For example, the patterning element holder can be an electrostatic chuck or some other type of clamp.

The patterning element stage mover 14B controls and adjusts the position of the patterning element stage 14A and the patterning element 16. For example, the patterning element stage mover 14B can move and position of the patterning element 16 with six degrees of freedom, e.g. along the X, Y, and Z axes, and about the X, Y, and Z axes. Alternatively, the patterning element stage mover 14B can be designed to move the patterning element 16 with less than six degrees of freedom, e.g. with three degrees of freedom. Further, in certain embodiments, the patterning element stage mover 14B and/or the patterning element holder can be controlled by the control system 24 to distort the patterning element 16 by stretching, bending, or compressing the patterning element 16 as needed. As provided herein, the patterning element stage mover 14B can include one or more piezoelectric actuators, planar motors, linear motors, voice coil motors, attraction only actuators, and/or other types of actuators. In certain embodiments, the range of motion of the patterning element stage 14A is relatively small.

The patterning element 16 diffracts the conditioned EUV beam 13C to create an image projected onto the workpiece 22. For example, the patterning element 16 can be a diffraction grating. In one embodiment, the patterning element pattern 16A of the patterning element 16 includes a periodic structure that reflects and diffracts the conditioned EUV beam 13C in multiple directions, including a first diffracted EUV beam 13D and a second diffracted EUV beam 13E that travel in different directions away from the patterning element 16. In one embodiment, the periodic structure of the patterning element 16 includes a pattern of parallel lines that are parallel to the Y axis. In an alternative embodiment, the patterning element 16 may be a periodic structure that alters the phase and/or the intensity of the EUV beam 13C. For example, the periodic structure may be a pattern of reflective and non-reflective lines at an appropriate pitch to create the desired diffracted beams. Alternatively, the periodic structure may be a pattern of lines that vary the optical phase of the EUV light to create the desired diffracted beams.

The projection optical assembly 18 directs the diffracted EUV beams 13D, 13E to form an image of the patterning element 16 onto a light-sensitive photoresist material on the semiconductor workpiece 22 positioned at an image plane of the projection optical assembly 18. In one embodiment, the projection optical assembly 18 is reflective and includes one or more optical elements that are operable in the EUV spectral range. More specifically, each optical element includes a working surface that is coated to reflect light in the EUV spectral range. Further, the optical elements are spaced apart from each other.

In FIG. 1A, the projection optical assembly 18 directs EUV light reflected from the patterning element 16, including the first diffracted EUV beam 13D and the second diffracted EUV beam 13E at the workpiece 22. Stated in another fashion, with the present embodiment, light waves diffracted or scattered from the patterning element 16 are collected by the projection optical assembly 18 and recombined to produce the image of the patterning element 16 on the workpiece 22. Because the patterning element 16 that scatters/diffracts the EUV beam is imaged onto the workpiece 22, the edges appear as sharp boundaries in the resist of the workpiece 22. Thus, one of the significant advantages of the projection optical system 18 is that it allows for well-defined edges to the exposure field 28. In FIG. 1A, the projection optical assembly 18 includes a first projection subassembly 44 and a second projection subassembly 46 that cooperate to form the image of the patterning element pattern on the workpiece 22. In contrast, if the projection optical system 18 merely directs the two diffracted EUV beams 13D, 13E to form an interference pattern on the workpiece 22, the edges will appear out of focus and blurred.

For example, (i) the first projection subassembly 44 can include a left, first projection optical element 44A, and a right, first projection optical element 44B that cooperate to direct the reflected EUV light; and (ii) the second projection subassembly 46 can include a left, second projection optical element 46A, and a right, second projection optical element 46B that cooperate to direct the reflected EUV light. In one embodiment, each first projection optical element 44A, 44B is a reflector that includes a working surface that is coated to reflect light in the EUV spectral range. Similarly, each second projection optical element 46A, 46B is a reflector that includes a working surface that is coated to reflect light in the EUV spectral range. In certain embodiments, optical elements 44A, 44B are formed as portions of a single EUV mirror. Similarly, optical elements 46A, 46B may be formed as portions of a single EUV mirror. Depending on the particular application, optical elements 44A, 44B may be two portions of a single curved mirror, or they may be separate components. Similarly, optical elements 46A, 46B may be two portions of a single curved mirror, or they may be separate components.

The workpiece stage assembly 20 holds the workpiece 22, positions and moves the workpiece 22 relative to the exposure field 28 to create the pattern 330 of parallel lines which are densely packed on the workpiece 22. As one non-exclusive example, the workpiece stage assembly 20 can includes a workpiece stage 48, and a workpiece stage mover 50 (illustrated as a box).

In the non-exclusive embodiment illustrated in FIG. 1A, the workpiece stage 48 is monolithic and includes a workpiece holder (not shown) that retains the workpiece 22. For example, the workpiece holder can be an electrostatic chuck or some other type of clamp.

The workpiece stage mover 50 controls and adjusts the position of the workpiece stage 48 and the workpiece 22 relative to the exposure field 28 and the rest of the EUV lithography system 10. For example, the workpiece stage mover 50 can move and position of the workpiece 22 with six degrees of freedom, e.g. along the X, Y, and Z axes, and about the X, Y, and Z axes. Alternatively, the workpiece stage mover 50 can be designed to move the workpiece 22 with less than six degrees of freedom, e.g. with three degrees of freedom. As provided herein, the workpiece stage mover 50 can include one or more planar motors, linear motors, voice coil motors, attraction only actuators, and/or other types of actuators.

In certain embodiments, the scanning velocity can be varied according to the size of the exposure field 28. Further, in certain embodiments, the workpiece stage mover 50 moves the workpiece 22 at a substantially constant velocity during each scanning processes.

The control system 24 is electrically connected and directs and controls (i) electrical current to the workpiece stage assembly 20 to control the position of the workpiece 22; (ii) electrical current to the patterning element stage assembly 14 to control the position and/or shape of the patterning element 16; (iii) the EUV illumination system 12 to control the EUV beam 13; and (iv) the shutter assembly 26 to adjust the shape of the exposure field 28. The control system 24 can include one or more processors 54, and electronic data storage.

The shutter assembly 26 shapes the EUV beam 13A and defines the shape of the exposure field 28 imaged on the workpiece 22. In one, non-exclusive embodiment, the shutter assembly 26 shapes the EUV beam so that the exposure field 28 has a generally rectangular shape.

Figure 1B:
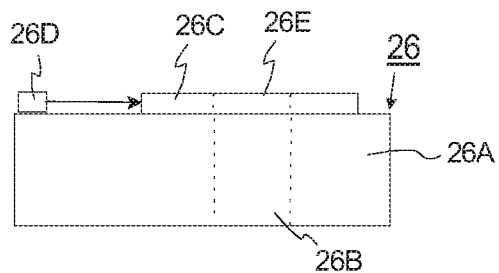
FIG. 1B is a simplified side view of a shutter assembly having features of the present embodiment.

FIG. 1B is a simplified side view of a non-exclusive example of the shutter assembly 26. In this embodiment, the shutter assembly 26 includes a rigid shutter housing 26A that defines a housing opening 26B (illustrated with dashed lines), a movable shutter 26C (illustrated with a box), and a shutter mover 26D (illustrated with a box). In this embodiment, the housing opening 26B defines generally the shape and size of the exposure field 28 (illustrated in FIG. 1A). However, in this embodiment, the movable shutter 26C can be selectively moved by the shutter mover 26D relative to the housing opening 26B to selectively cover a portion, cover all, or not cover the housing opening 26B to adjust the size of the exposure field 28 along the Y axis (illustrated in FIG. 1A).

In FIG. 1B, the movable shutter 26C includes a shutter opening 26E. With this design, the movable shutter 26 can be moved back and forth to selectively and alternatively adjust the size of the exposure field 28 from either direction along the Y axis (the scan direction).

Further, the shutter mover 26D can be a motor that is controlled by the control system 24 (illustrated in FIG. 1A) to selectively and alternatively adjust the size of the exposure field 28 from either direction along the Y axis during the scanning process, depending upon the scan direction. In alternative embodiments, the shutter assembly 26 may include additional actuators or moving parts to allow modifications of the shape of the exposure field 28 to correct for non-uniformity of the EUV illumination or other effects.

With reference back to FIG. 1A, the shutter assembly 26 can be positioned in a number of different locations along a beam path 55 between the EUV illumination source 34 and the workpiece 22. For example, the shutter assembly 26 can be positioned along the beam path 55 (i) in proximity to the patterning element 16, (ii) in proximity to the workpiece 22, or (iii) at or near an intermediate image plane. In the embodiment illustrated in FIG. 1A, the shutter assembly 26 is positioned along the beam path 55 at intermediate image plane 56 between the second illumination optical element 40 and the third illumination optical element 42. As a result thereof, the conditioned EUV beam 13C directed at the patterning element 16 is already shaped. In alternative embodiments that have an intermediate image plane at another location, such as between the patterning element 16 and the workpiece 22, the pattern shutter 26 can be positioned along the beam path 55 at that intermediate image plane (not shown).

It should be noted that any of EUV beams 13A, 13C, 13D, 13E can be referred to generally as an EUV beam. Further, as used herein, the term beam path 55 shall refer to the path that the EUV beam travels from the illumination source 34 to the workpiece 22.

FIG. 2A is a simplified top view of a workpiece 22 that has been processed to include the existing pattern 233 (only a portion is illustrated as small circles) having a plurality of adjacent dies 260 (also referred to as "exposure shots", "shots", or "chips") on the workpiece 22. The design of the existing pattern 233, and the number, size and shape of the dies 260 can be varied. In the non-exclusive example illustrated in FIG. 2A, the workpiece 22 has been processed to include ninety-six rectangular shaped dies 260. Further, for a three hundred millimeter diameter workpiece 22, each of the dies 260 can be, for example, twenty-six millimeters (along the X axis) by thirty-three millimeters (along the Y axis). However, other numbers and other sizes are possible. A center of each die 260 is identified with a plus sign. Each die 260 can be created on the workpiece 22 using a step and repeat lithography system or a step and scan lithography system (not shown) that exposes an area on the workpiece 22 to create one of the dies 260 and subsequently stepped to another area to create another die 260. This process is repeated until the entire existing pattern 233 is completed.

Unfortunately, as provided herein, the existing pattern 233 on the workpiece 22 is often distorted. As non-exclusive examples, distortion of the existing pattern 233 can be caused by temperature changes in the workpiece 22 during the various processing steps, residual stress in the workpiece 22, chucking of the workpiece 22, etching of the workpiece 22, chucking of a reticle used in the step and repeat lithography system, and/or irregularities in the projection optical assembly of the step and repeat lithography system.

Figure 2B:
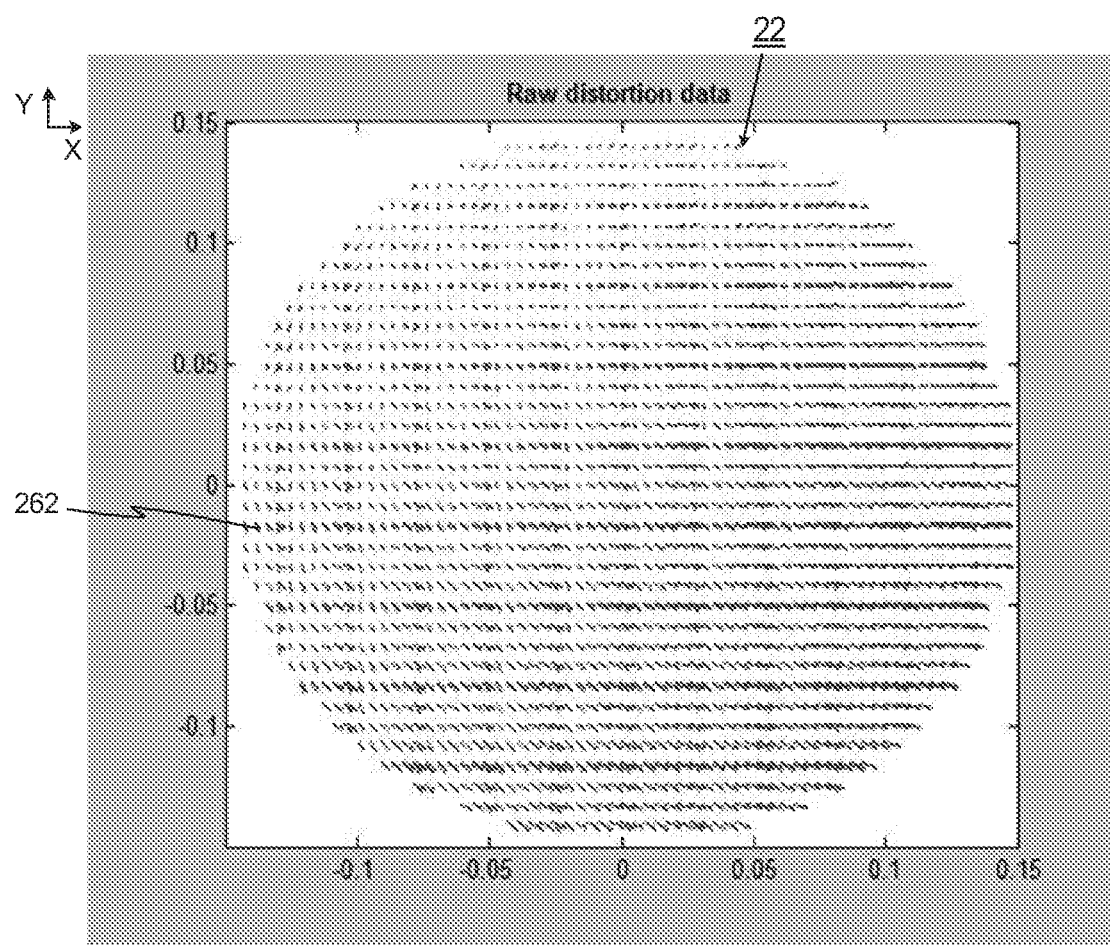
FIG. 2B is a simplified graph illustrating raw, broad distortion data for a workpiece processed with a step and repeat or step and scan lithography system.

FIG. 2B is a simplified graph illustrating the raw, broad distortion data for a workpiece 22 processed with the step and repeat lithography system. It should be noted that the raw distortion data will be different for each workpiece 22. In FIG. 2B, the distortion is represented by a plurality of tiny vectors (arrows) 262 at a plurality of alternative, spaced apart locations on the workpiece 22. These vectors 262 illustrate how the existing pattern 233 (illustrated in FIG. 2A) is distorted at those particular locations relative to a desired pattern (not shown). Generally, the size of the vector 262 represents the size of the distortion and the direction represents the direction of the distortion from their proper position.

In FIG. 2B, the X axis and Y axis dimensions of the workpiece 22 are also illustrated for reference. In this example, the workpiece 22 has a three hundred millimeter diameter. It should be noted that for the workpiece 22 illustrated in FIG. 2B, the distortion is the highest in the lower right quadrant and the lowest in the upper left quadrant.

As a non-exclusive example, the distortion data can be generated by precisely measuring the existing pattern 233 and comparing the existing pattern 233 to the desired pattern.

It should be noted that the broad distortion data illustrated in FIG. 2B includes two major effects, namely (i) how the workpiece 22 has been globally stretched or distorted, and (ii) how each of the dies 260 is distorted.

Figure 2C:
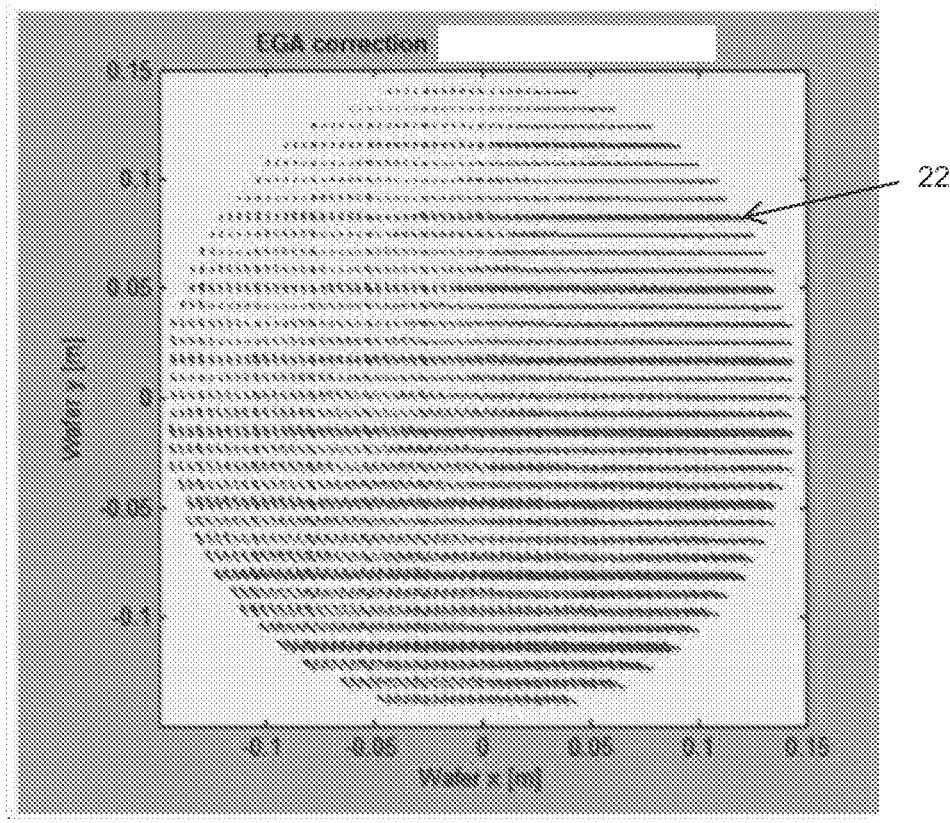
FIG. 2C is a simplified graph illustrating only the global distortion data for the workpiece.

FIG. 2C is a simplified graph illustrating only the global distortion data (with small arrows) for that workpiece 22. Stated in another fashion, FIG. 2C is a linear fit of the data that illustrates how the whole workpiece 22 is distorted. This can also be referred to as inter-shot distortion data or workpiece distortion data.

It should be noted that for the workpiece 22 illustrated in FIG. 2C, the global distortion of the workpiece 22 is the highest in the lower right quadrant and the lowest in the upper left quadrant.

For example, the global distortion data in FIG. 2C can be generated by fitting linear equations for the X and Y distortion components to the raw data shown in FIG. 2B.

Figure 2D:
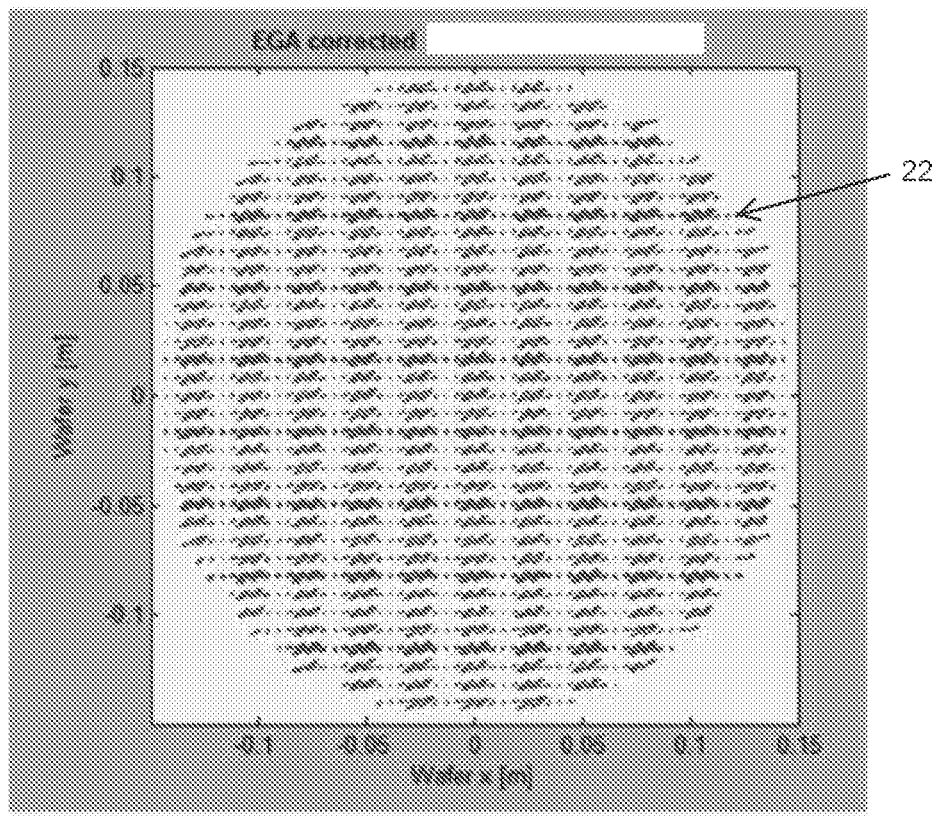
FIG. 2D is a simplified graph illustrating the distortion data for each die of the workpiece.

FIG. 2D is a graph illustrating the distortion data (with small arrows) for each die 260 of that workpiece 22. It should be noted that for the workpiece 22 illustrated in FIG. 2D, the distortion for each die 260 is approximately the same (consistent and repetitive). This is because the die distortion from a step and repeat or step and scan exposure process is typically caused by gravity sag of the reticle used during exposure (not shown), temperature fluctuations of the reticle, distortion of the reticle caused by chucking, and distortion characteristics of the projection lens assembly of the lithography system. The die distortion can also be referred to as intra-shot distortion data.

It should be noted that the die distortion data can be calculated by subtracting the workpiece distortion data from FIG. 2C from the broad, overall distortion data from FIG. 2B.

Figure 2E:
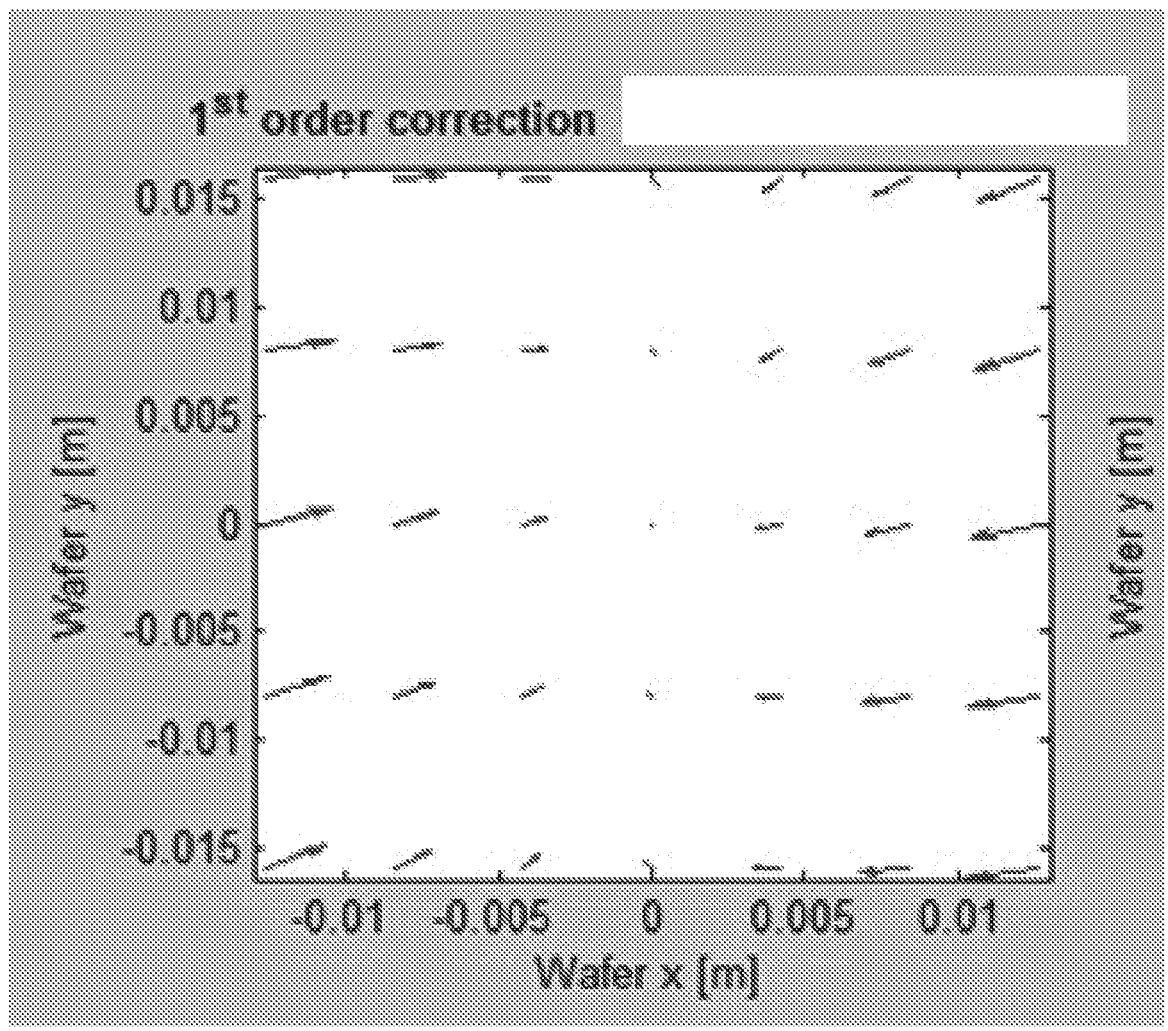
FIG. 2E includes a graph that illustrates the common distortion shape of the dies.

FIG. 2E shows a graph that was generated using the die distortion data from FIG. 2D to estimate the common distortion shape for each of the ninety-six dies 260. In FIG. 2E, the graph illustrates the common distortion shape for each die generated using linear polynomial equations (first order correction).

Figure 2F:
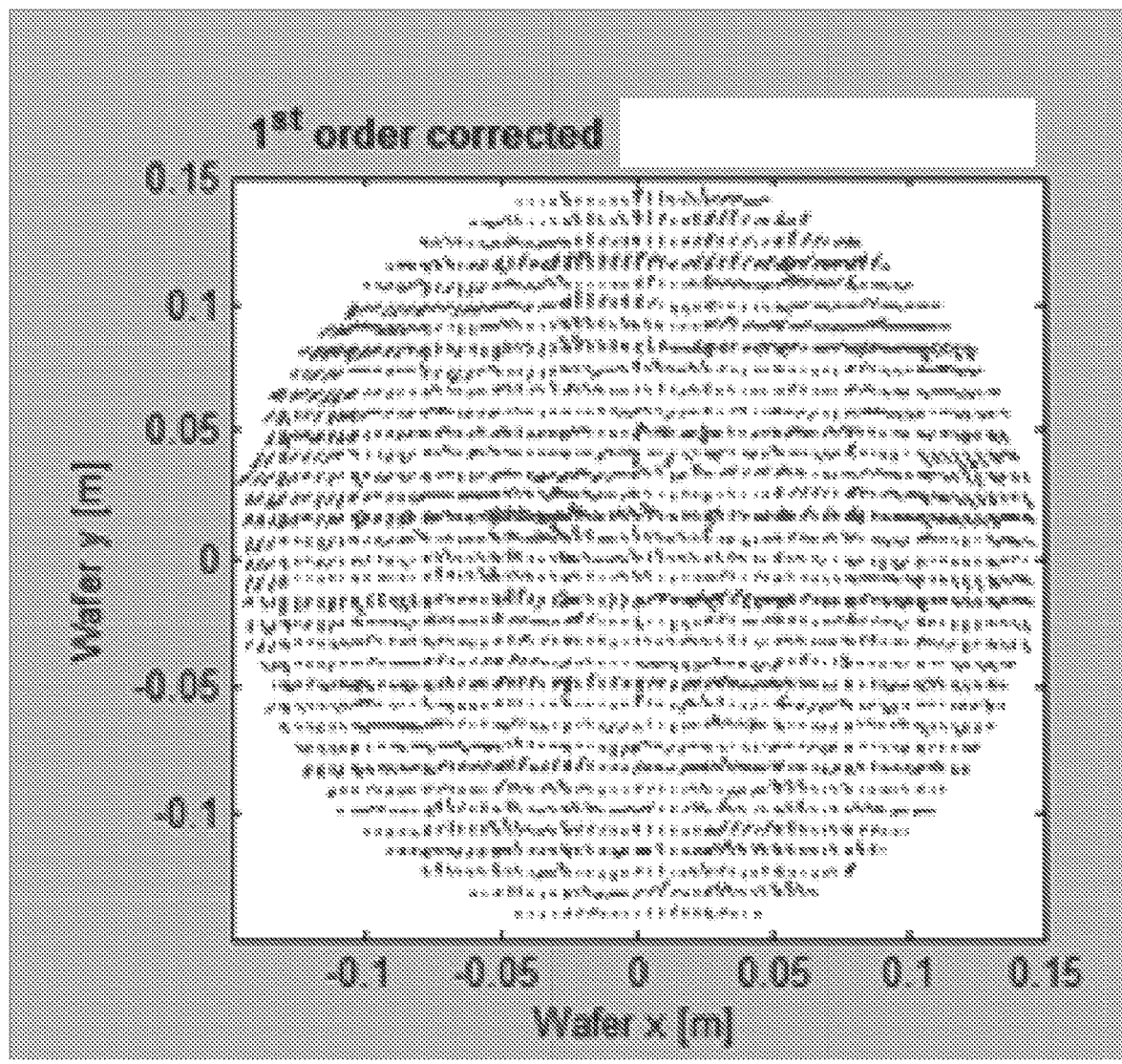
FIG. 2F includes a graph that illustrates residual distortion data.

FIG. 2F illustrates the residual distortion data. More specifically, the residual distortion data illustrated in FIG. 2F is obtained by subtracting the graph of FIG. 2E from the die distortion data of FIG. 2D.

Figure 3A:
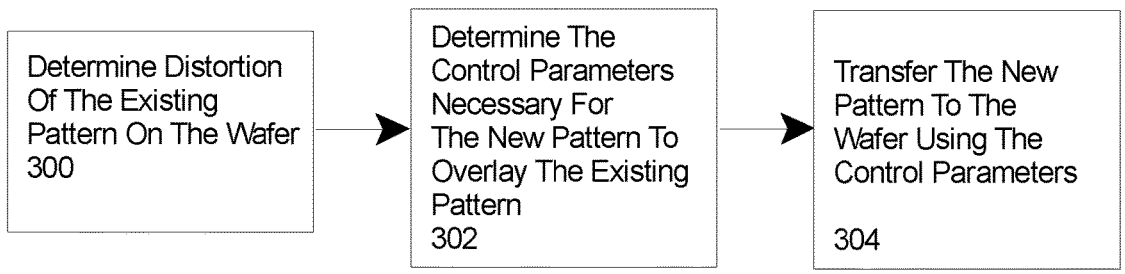
FIG. 3A is a flow chart illustrating a procedure having features of the present embodiment.

FIG. 3A is a simplified flow chart that illustrates the steps taken for the new pattern 330 generated by the EUV lithography system 10 of FIG. 1A to overlay and match the existing pattern 233. More specifically, at block 300, the distortion data of the existing pattern on the workpiece is determined. Once the distortion data for the workpiece is determined, one or more control parameters necessary for the new pattern to overlay the existing pattern 302 are determined at block 302. Stated in another fashion, using the distortion data of the existing pattern 233, the desired location and characteristics of the new pattern 330 can be determined so that the plurality of lines of the new pattern 330 matches and overlays the distorted existing pattern 233. As provided herein, the one or more control parameters for each scan that creates the new pattern 330 can be determined so that the new pattern 330 overlays the distorted existing pattern 233. Steps 300 and 302 can be performed offline and before beginning exposure of the new pattern 330.

As a non-exclusive examples, the control parameters for the EUV lithography system 10 during the generation of the new pattern 330 can include adjustments to each scan trajectory (e.g. an X axis offset of the workpiece, a theta Z axis (θz) rotation of the workpiece), a magnification change of the patterning element pattern during one or more scans, and/or a magnification tilt of the patterning element pattern during one or more scans. Further, these control parameters can be determined as a function of the X and/or Y axis position(s) of the workpiece. Determining the desired new pattern and each of these control parameters can be found by several potential methods: (i) fitting a polynomial or other analytical expression to the measured data; (ii) interpolating between measurement points and smoothing any discontinuities; (iii) solving an optimization problem that minimizes the residual error while maintaining a trajectory that meets stage limitations on velocity, acceleration, and jerk; and (iv) using a digital filter to smooth the trajectory.

Next, at block 304, the new pattern 330 is transferred to the workpiece 22 using the control parameters. More specifically, the EUV lithography system 10 illustrated in FIG. 1A can be controlled to match and overlay the new dense line pattern 330 across the entire workpiece 22 to the existing pattern 233 by adjusting the scan trajectory, magnification, and magnification tilt of the patterning element pattern while scanning and exposing the workpiece 22 to compensate for the distortion of the workpiece 22 during previous processing. With this design, the EUV lithography system 10 will generate and distort the new pattern 330 in a matching fashion so that it is more accurately aligned with the existing pattern 233 which is already present on the workpiece 22 than if the control parameters were not adjusted.

Figure 3B:
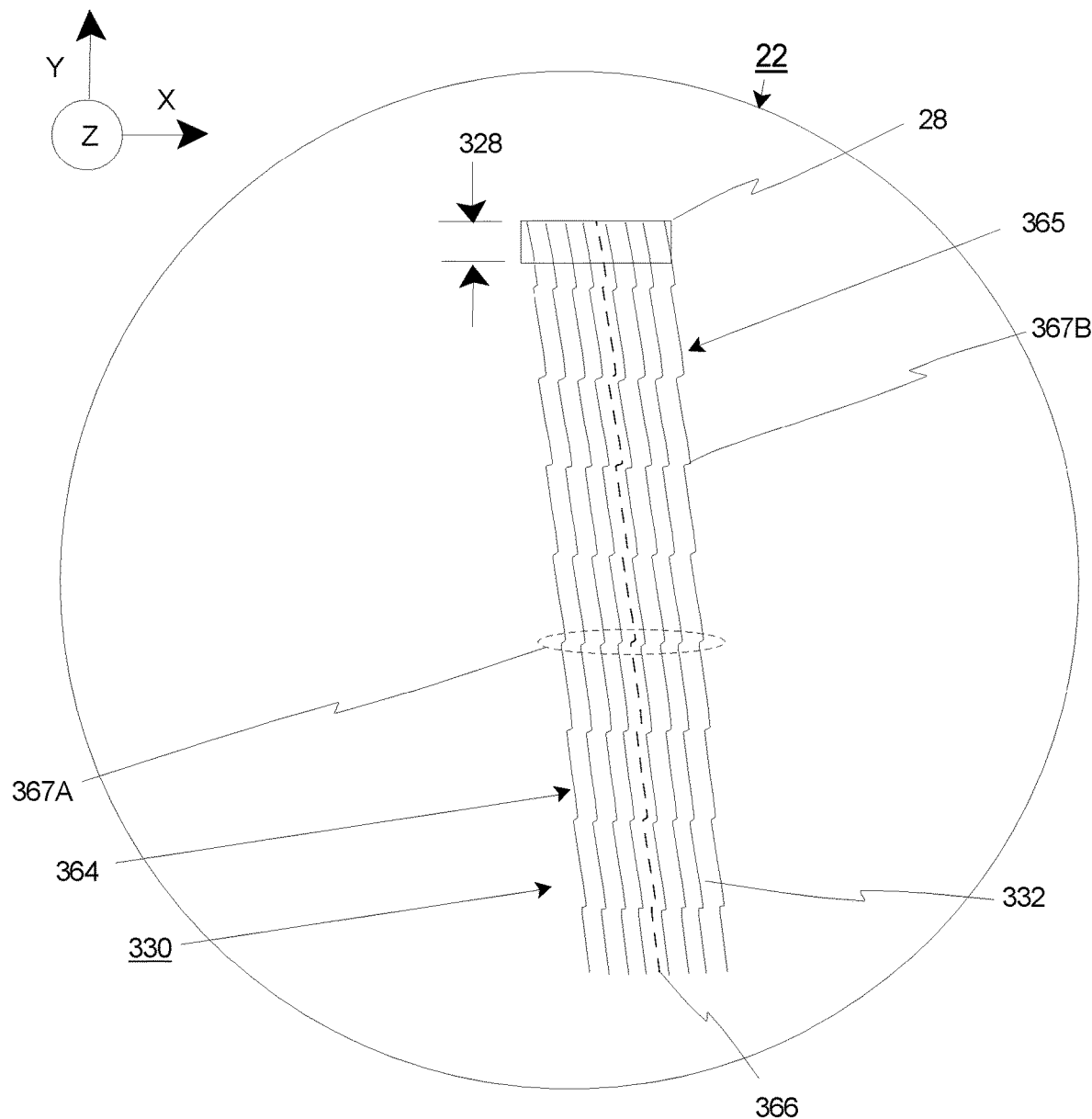
FIG. 3B is a simplified top view of a workpiece including a first stripe of parallel lines.

FIG. 3B is a simplified illustration of the workpiece 22 that includes a portion of a new pattern 330 of parallel lines 332 formed with the EUV lithography system 10 of FIG. 1A. At this time, only a first stripe 364 of densely packed, generally parallel lines 332 has been transferred to the workpiece 22. However, when finished, almost the entire surface of the workpiece 22 will include the densely packed, generally parallel lines 232. It should be noted that the X axis spacing and shape of the lines 332 is greatly exaggerated in FIG. 3B for clarity. In this embodiment, each of the parallel lines 332 extends across the entire workpiece 22 substantially parallel to the Y axis and orthogonal to the X axis. It should be noted that the parallel lines 332 shown in FIG. 3B are merely illustrative. It should be understood that in one (i.e. semiconductor wafer) non-exclusive embodiment, the spacing (pitch) between adjacent parallel lines 332 may range from ten (10) to forty (40) nanometers. It should be understood, however, that this pitch range should not be construed as limiting. Parallel lines 332 having a pitch smaller than ten (10) nanometers (for example) or larger than forty (40) nanometers (for example) can be patterned onto a workpiece 22 using the EUVL tool 10. In alternative, non-exclusive examples, the adjacent parallel lines 332 can have a pitch of less than seventy, sixty, fifty, forty, thirty, twenty, ten or five nanometers. Furthermore, as used herein, the phrase "densely packed" means a substantially continuous pattern of lines. While in most cases the densely packed lines will cover substantially an entire workpiece surface, this is by no means a requirement. In alternative embodiments, the parallel lines may have periodic gaps and/or variations in pitch.

FIG. 3B also illustrates the rectangular shaped exposure field 28 created by the EUV lithography system 10 of FIG. 1A on the workpiece 22. In this example, the first stripe 364 of parallel lines 332 were transferred to the workpiece 22 during a first scan 365 of the workpiece 22 relative to the exposure field 28. In the first scan 365, the stage mover 50 (illustrated in FIG. 1A) is controlled to move the workpiece 22 (downward on the page in FIG. 3B) relative to the exposure field 28 along a first scan trajectory 366 (illustrated with a thicker, dashed line) to create the first stripe 364 of parallel lines 332. In FIG. 3B, the first scan trajectory 366 is jagged shaped and extends generally parallel to the Y axis. More specifically, in the first scan, the first scan trajectory 366 is generally along the Y axis, but includes some movement along the X axis, and about the Z axis so that the new pattern 330 matches the existing pattern 233. As provided herein, the movement of the workpiece 22 during the first scan along the X axis and about the Z axis can be a function of the position of the workpiece 22 along the Y axis.

Additionally, as provided herein, the magnification of the patterning element pattern 16A (illustrated in FIG. 1A) and the magnification of the patterning element tilt of the patterning element pattern 16A can be varied during the first scan 365 so that the new pattern 330 closely overlays the existing pattern 233. For example, in certain embodiments, adjusting the focus position of the patterning element 16 (illustrated in FIG. 1A) or the workpiece 22 will create a magnification change of the parallel lines 332. Using this effect, the patterning element 16 and/or workpiece 22 can be moved slightly in the focus direction to make small changes in the pitch of the printed lines 332. Moreover, by tilting the patterning element 16 and/or the workpiece 22 slightly about the Y axis, a "magnification tilt" can be created where the printed pitch changes linearly across the exposure field 28 in the X direction.

Further, in FIG. 3B, the first stripe 364 includes eight, spaced apart lines that are merely representative of a very large number (e.g., millions) of densely packed lines that were printed onto the workpiece 22 during the single scan along the first scan trajectory 366. In one embodiment, the width of the first stripe 364 of lines 332 (and the exposure field 328 on the workpiece 22) can be several millimeters wide. For example, the width of the exposure field 328 can be approximately five millimeters wide. As alternative, non-exclusive examples, the spacing (pitch) between adjacent parallel lines 232 can be less than approximately 5, 10, 20, 30, 40, 50, 60, or 70 nanometers. As provided herein, "densely packed" means a substantially continuous pattern of lines without any gaps or significant variations in the spacing.

As illustrated in FIG. 3B, in certain embodiments, during the printing of the continuous first stripe 364 with the EUV lithography system 10 across the workpiece 22, it is necessary to make relatively sharp changes to the first scan trajectory 366 at each boundary 367A (one is highlighted with a dashed oval) of adjacent dies 260 (illustrated in FIG. 2A). Stated in another fashion, during the first scan 365, the first scan trajectory 366 can extend generally along the Y axis, with sharp discontinuities 367B at each boundary 367A of adjacent dies 260. These discontinuities 367B are necessary to adjust the first scan trajectory 366 at these boundaries 367A so that the first stripe 364 overlaps the existing pattern 233 printed on the dies 260 with a step and repeat or step and scan lithography system. It should be noted that in FIG. 3B, the new pattern 330 is transferred across nine dies 260 that are aligned in a column. Thus, there are eight boundaries 367A and the first scan trajectory 366 includes eight discontinuities 367B.

In certain embodiments, in order to continuously transfer the first stripe 364, it may be necessary for the workpiece 22 to be moved slowly during the first scan 365 and/or for the system to be designed so that the exposure field 28 is has a Y axis dimension 328 that is relatively small. For example, in alternative, non-exclusive examples, the Y axis dimension 328 can be less than approximately 0.2, 1, 2, 3, 5, or 10 millimeters.

After the first stripe 364 is created, the workpiece 22 can be stepped along the X axis and subsequently scanned in the opposite direction to create the next stripe of parallel lines. The scanning processes and stepping processes are alternatively performed until the entire pattern 330 of parallel lines 332 are created on the workpiece 22.

Figure 3C:
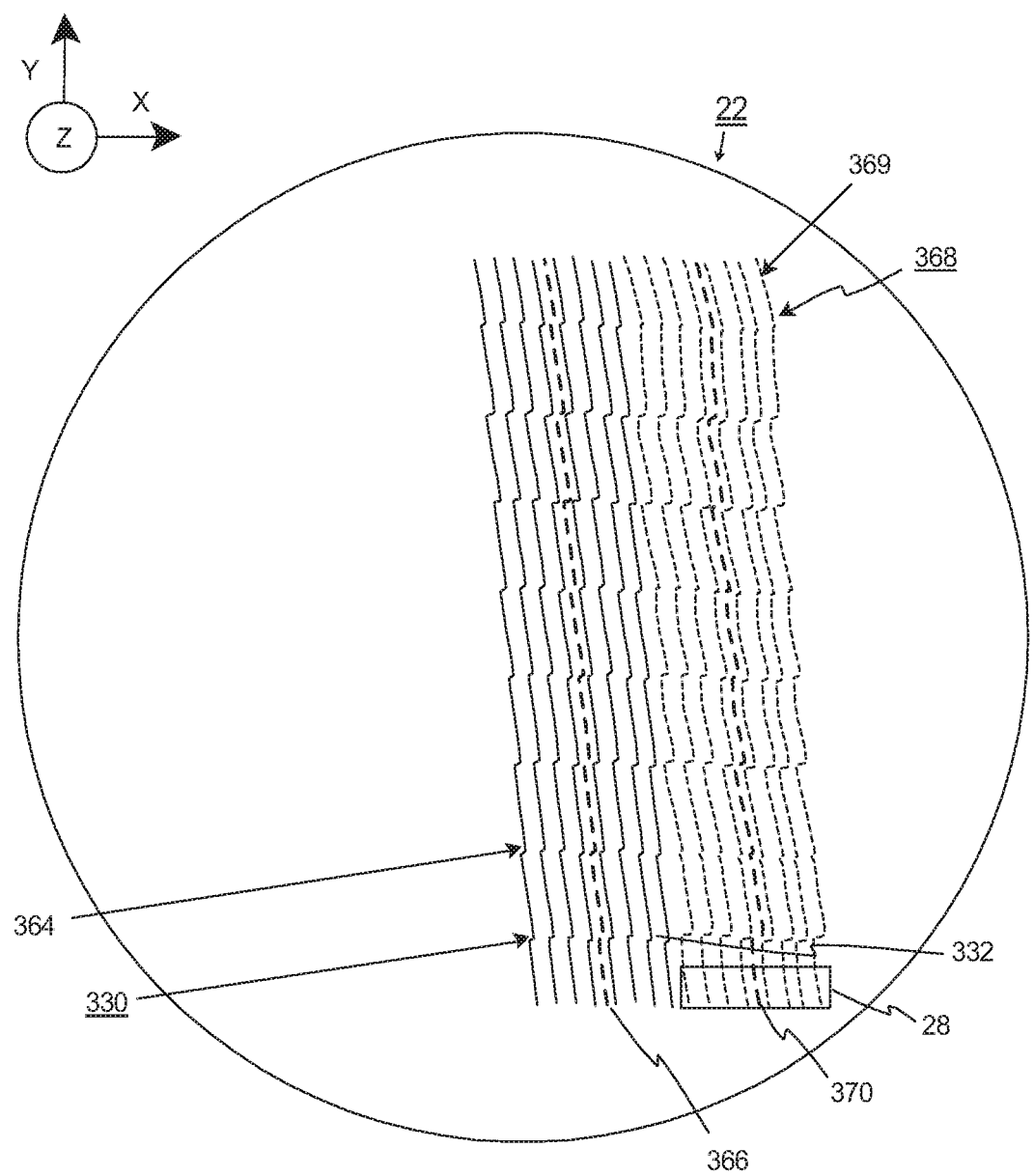
FIG. 3C is a simplified top view of a workpiece including the first stripe of parallel lines and a second stripe of parallel lines.

More specifically, FIG. 3C is a simplified illustration of the workpiece 22 that includes a second stripe 368 (illustrated with short dashes) of parallel lines 332 in addition to the first stripe 364 formed with the EUV lithography system 10 of FIG. 1A.

FIG. 3C also illustrates the rectangular shaped exposure field 28 created by the EUV lithography system 10 of FIG. 1A on the workpiece 22. In this example, the second stripe 368 of parallel lines 332 were transferred to the workpiece 22 during a second scan 369 of the workpiece 22 relative to the exposure field 28. In the second scan 369, the stage assembly 20 (illustrated in FIG. 1A) is controlled to move the workpiece 22 (upward in the drawing) relative to the exposure field 28 along a second scan trajectory 370 (illustrated with a thicker, dashed line) to create the second stripe 368 of parallel lines 332. In FIG. 3B, the second scan trajectory 370 is jagged shaped and extends generally parallel to the Y axis. More specifically, in the second scan 369, the second scan trajectory 370 is generally along the Y axis, but includes some movement along the X axis, and about the Z axis so that the new pattern 330 matches the existing pattern 233. As provided herein, the movement along the X axis and about the Z axis can be a function of the position of the workpiece 22 along the Y axis. These adjustments will allow aligning the printed new pattern 330 to the average displacement of the existing pattern 233 in the X direction, and "steering" of the patterning element lines 332 as they are printed across the diameter of the workpiece 22.

Additionally, as provided herein, the magnification of the patterning element pattern 16A (illustrated in FIG. 1A) and the magnification tilt of the patterning element pattern 16A can be varied during the second scan 369 so that the new pattern 330 more closely overlays the existing pattern 233 than if these adjustments were not made.

It should be noted that the second scan trajectory 370 is slightly different from the first scan trajectory 366 because that distortion of the workpiece 22 is different in this area. As a result thereof, the second stripe 368 is slightly different from the first stripe 364.

Thus, as provided herein, the scan trajectory 366, 370 of the workpiece 22 relative to the exposure field 28, the magnification and/or magnification tilt can be varied for and during each scan 365, 369 to tailor each stripe 364, 368 to more accurately overlay the existing pattern 233. Stated in another fashion, the scan trajectory 366, 370, the magnification, and the magnification tilt will be different for different areas based on the amount of distortion of the existing pattern 233.

Figure 3D:
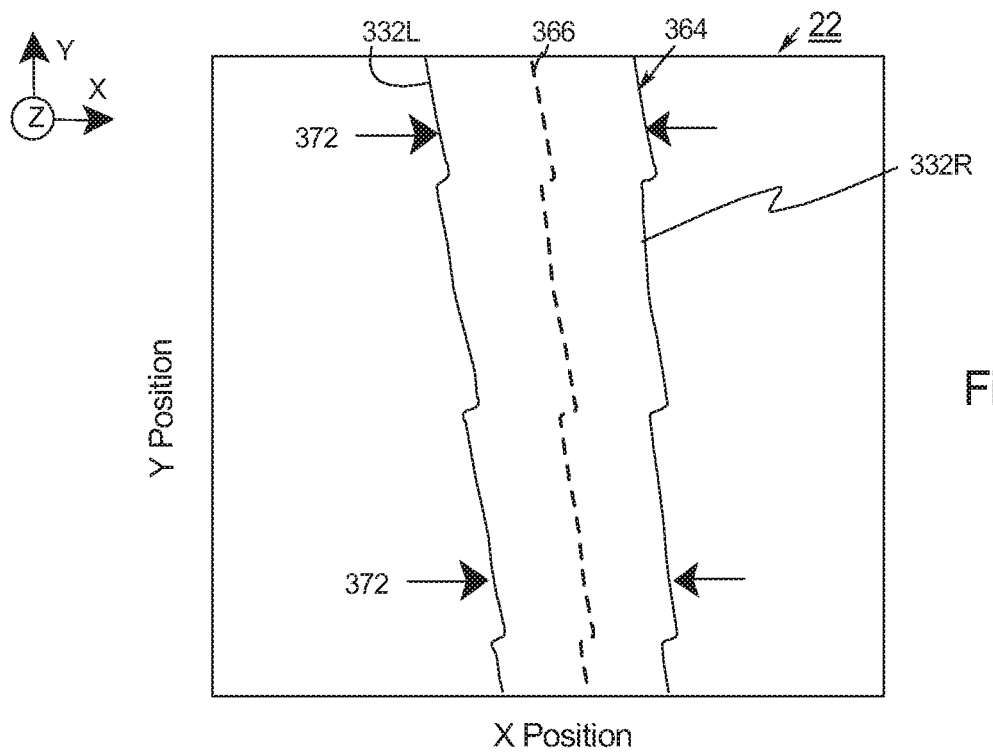
FIG. 3D is simplified top view of a portion of the patterning element pattern projected onto the workpiece.

FIG. 3D is a simplified illustration of a portion of the first stripe 364 that was transferred to the workpiece 22. In this Figure, a portion of the first scan trajectory 366 is illustrated with a thicker, dashed line and the leftmost line 332L and the rightmost line 332R are illustrated. In this embodiment, the first scan trajectory 366 is generally along the Y axis, but includes some movement along the X axis, and about the Z axis so that the new pattern 330 matches the existing pattern 233.

It should be noted that the first stripe 364 has a stripe width 372 measured generally along the X axis between the lines 332L, 332R. As provided herein, the exposure apparatus 10 provided herein is controlled to selectively adjust the magnification of the patterning element pattern 16A directed at the workpiece 22 to selectively adjust the stripe width 372 of the first stripe 364 along the scan trajectory 366 during scanning so that the first stripe 364 matches the existing pattern 233. In FIG. 3D, the stripe width 372 decreases from top to bottom. However, the stripe width 372 can be varied in any fashion along the first scan trajectory 366 as needed so that the first stripe 364 more accurately overlays the existing pattern 233 than without the magnification adjustment.

As non-exclusive examples, the adjustment of the focus position of the patterning element 16 (illustrated in FIG. 1) or the workpiece 22 will create a magnification change that changes the stripe width 372 along the first scan trajectory 366. Using this effect, the patterning element 16 and/or workpiece 22 can be moved slightly with the respective stage assembly in the focus direction (up or down along the Z axis) to make small changes in the pitch (selectively adjusting the pitch) of the printed lines 332L, 332R. In another embodiment, the patterning element pattern 16A (illustrated in FIG. 1A) can be selectively, mechanically stretched or compressed along the X axis by the patterning element stage assembly 14 to change the magnification. Still alternatively, the temperature of the patterning element 16 can be adjusted to mechanically change the pitch of the patterning element pattern 16A.

Figure 3E:
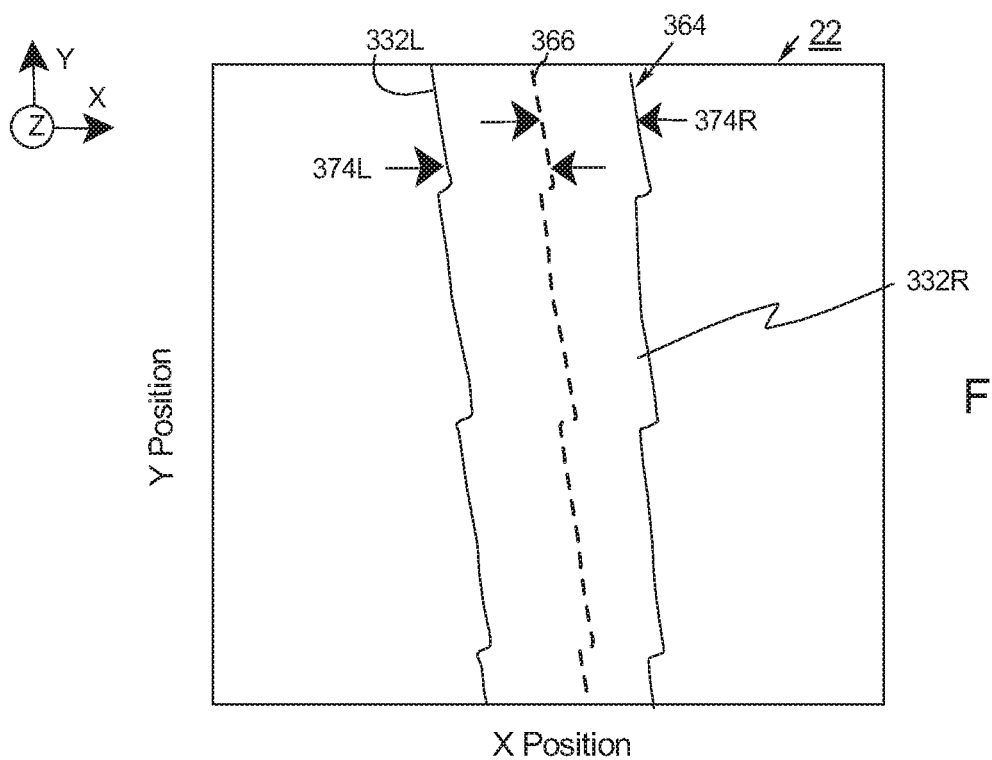
FIG. 3E is simplified top view of another portion of the patterning element pattern projected onto the workpiece.

FIG. 3E is a simplified illustration of another portion of the first stripe 364 that was transferred to the workpiece 22. In this Figure, a portion of the first scan trajectory 366 is illustrated with a thicker, dashed line and the leftmost line 332L and the rightmost line 332R are again illustrated. In this embodiment, the first scan trajectory 366 is again generally along the Y axis, but includes some movement along the X axis, and about the Z axis so that the new pattern 330 more closely matches the existing pattern 233 than if the scan trajectory was not adjusted.

It should be noted that the first stripe 364 has (i) a left intermediate width 374L measured generally along the X axis between the leftmost line 332L and the scan trajectory 366, and (ii) a right intermediate width 374R measured generally along the X axis between the rightmost line 332R and the scan trajectory 366. As provided herein, the exposure apparatus 10 provided herein is controlled to selectively adjust the magnification tilt of the patterning element pattern 16A directed at the workpiece 22 to selectively adjust the left intermediate width 374L and the right intermediate width 374R during scanning so that the first stripe 364 matches the existing pattern 233. In FIG. 3E, (i) the intermediate widths 374L, 374R are approximately equal at the top, and (ii) the left intermediate width 374L is greater than the right intermediate width 374R near the bottom due to adjustments in the magnification tilt. However, the intermediate width 374L, 374R can be varied in any fashion along the first scan trajectory 366 as needed so that the first stripe 364 overlays the existing pattern 233.

As non-exclusive examples, the adjustment to the magnification tilt can be achieved by rotating the patterning element pattern 16A about the Y axis with the patterning element stage mover 14B (illustrated in FIG. 1A) or rotating the workpiece 22 about the Y axis with the stage assembly 20 (illustrated in FIG. 1A). By tilting the patterning element 16 and/or the workpiece 22 slightly about the Y axis, a "magnification tilt" can be created where the printed pitch of the lines 332L, 332R changes linearly across the exposure field in the X direction. For example, the patterning element 16 can be rotated slightly in a first direction about the Y axis to decrease the left intermediate width 374L, and rotated slightly in an opposite, second direction about the Y axis to increase the left intermediate width 374L.

All of the adjustments provided herein will allow improved aligning of the printed new pattern 330 to the average displacement of the existing pattern 233 in the X direction, and "steering" of the patterning element lines 332 as they are printed across the workpiece 22.

Figure 3F:
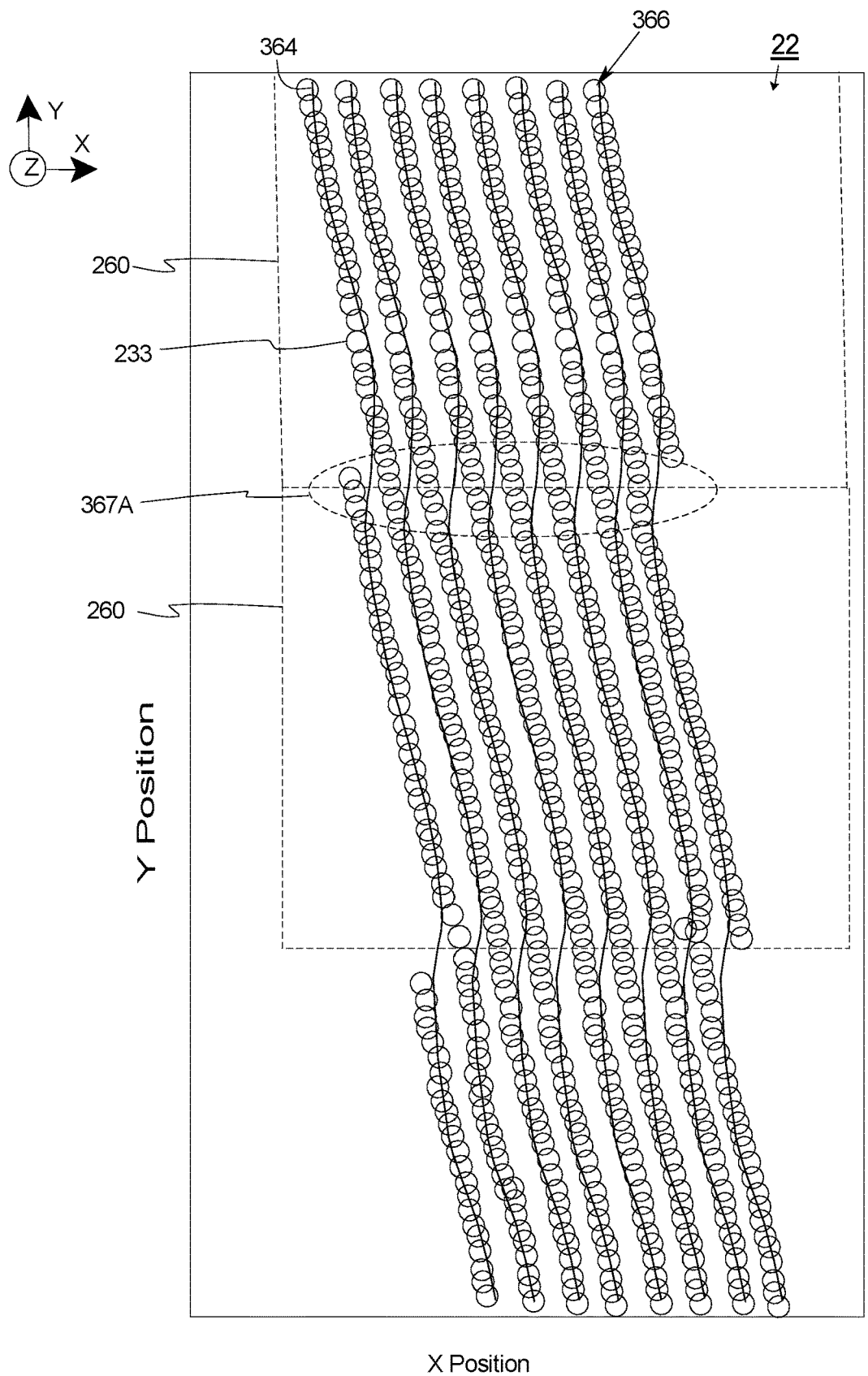
FIG. 3F is simplified top view of a portion of the workpiece with a portion of a new pattern overlaying an existing pattern.

FIG. 3F is an enlarged, simplified illustration of a portion of the existing pattern 233 (illustrated with small circles that represent points on the existing pattern) and a portion of the first stripe 364 of the new pattern 330 that was transferred to the workpiece 22. FIG. 3F illustrates how the first stripe 364 is tailored so that it closely overlaps the existing pattern 233. It should be noted that in the middle of each of the dies, the first stripe 364 closely overlays the existing pattern 233. However, at the boundaries 367A (one is highlighted with a dashed oval) of adjacent dies 260 (two are illustrated with dashed lines) there can be some differences between the first stripe 364 and the existing pattern 233 because of the rapid change at the boundary 367A of adjacent dies 260.

A couple of alternative methods for controlling the EUV lithography system 10 are provided herein that allow the first stripe 364 to better follow the existing pattern 233 at the boundaries 367A.

Figure 4A:
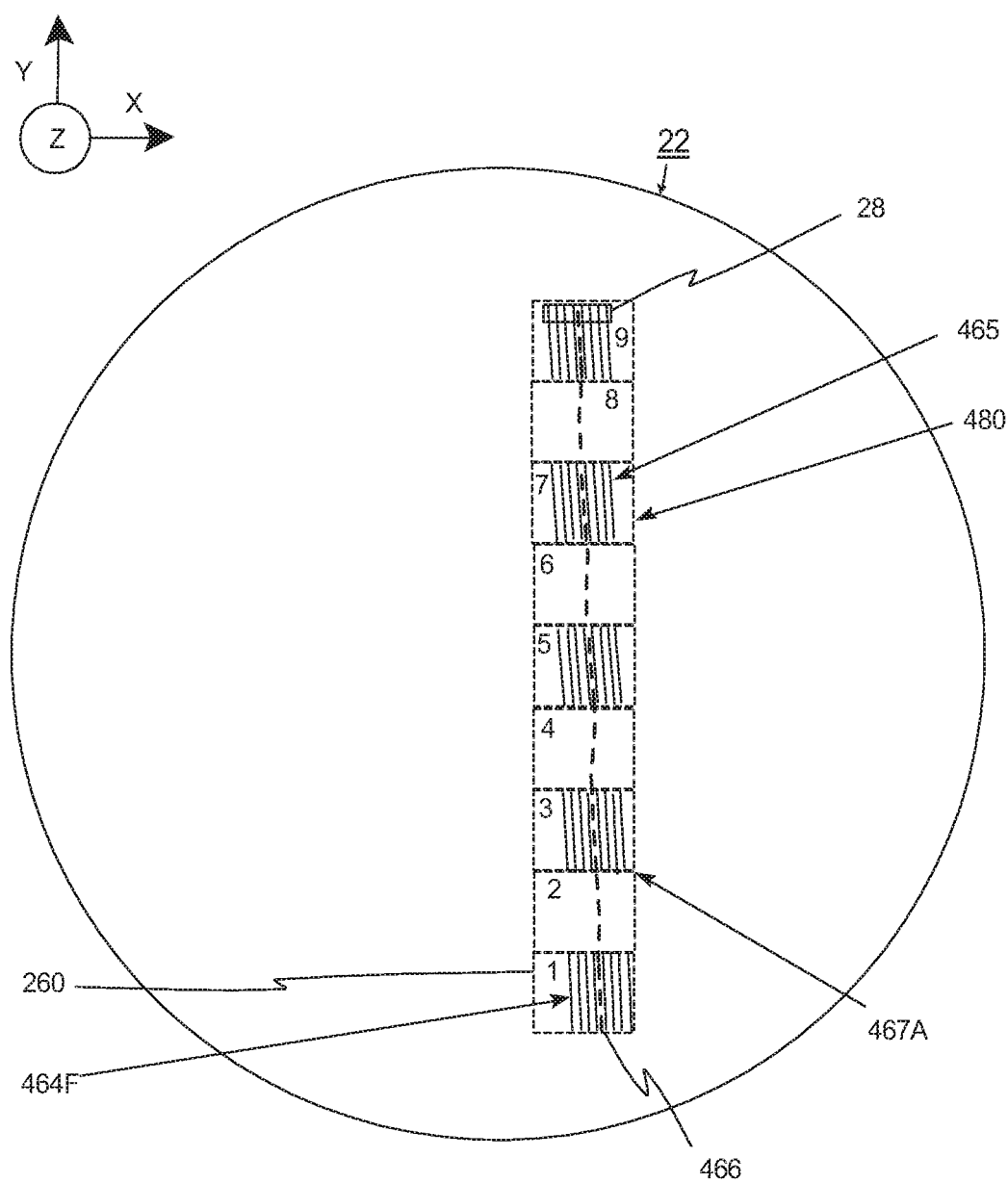
FIG. 4A is a simplified top view of the workpiece with a first portion of the first stripe of parallel lines.

For example, FIG. 4A is a simplified illustration of the workpiece 22 that illustrates yet another first scan 465 of the workpiece 22 along a first scan trajectory 466 past the exposure field 28. In this embodiment, the extreme ultraviolet lithography system 10 (illustrated in FIG. 1A) is controlled so that every other die 260 (illustrated as dashed rectangles) in a die column 480 along the first scan trajectory 466 is not exposed during the first scan 465. In this example, during the first scan 465, the workpiece 22 is moved so that nine dies 260 that are aligned in a die column 480 along the Y axis pass under the exposure field 28. It should be noted that these dies 260 were previously created, and only one of the die columns 480 is illustrated in FIG. 4A for clarity. Further, moving from the bottom to the top of the die column 480, the dies 260 have been labelled 1-9 for ease of discussion.

In this example, the extreme ultraviolet lithography system 10 is controlled so that every odd numbered die 260 (e.g. dies 1, 3, 5, 7, 9) is exposed during the first scan 465 along the first scan trajectory 466 to create a first portion 464F of the first stripe, and every even numbered die 260 (e.g. dies 2, 4, 6, 8) is not exposed during the first scan 465 along the first scan trajectory 466. With this design, the stage assembly 20 can be controlled during the first scan 465 to better match the first portion 464F to the existing pattern 233 (illustrated in FIG. 2A) at the boundaries 467A of the odd numbered dies 260. Basically, during the first scan 465, the area of the even numbered dies 260 provide time to move the workpiece 22 to the proper relative position for accurate printing of the next odd numbered die 260. In summary, in the first scan 465, only the "odd number" dies 260 are exposed, interpolating a smooth trajectory while passing over the "even number" dies 260 with the exposure light turned off (and/or blocked by the shutter assembly 26 illustrated in FIG. 1A).

Figure 4B:
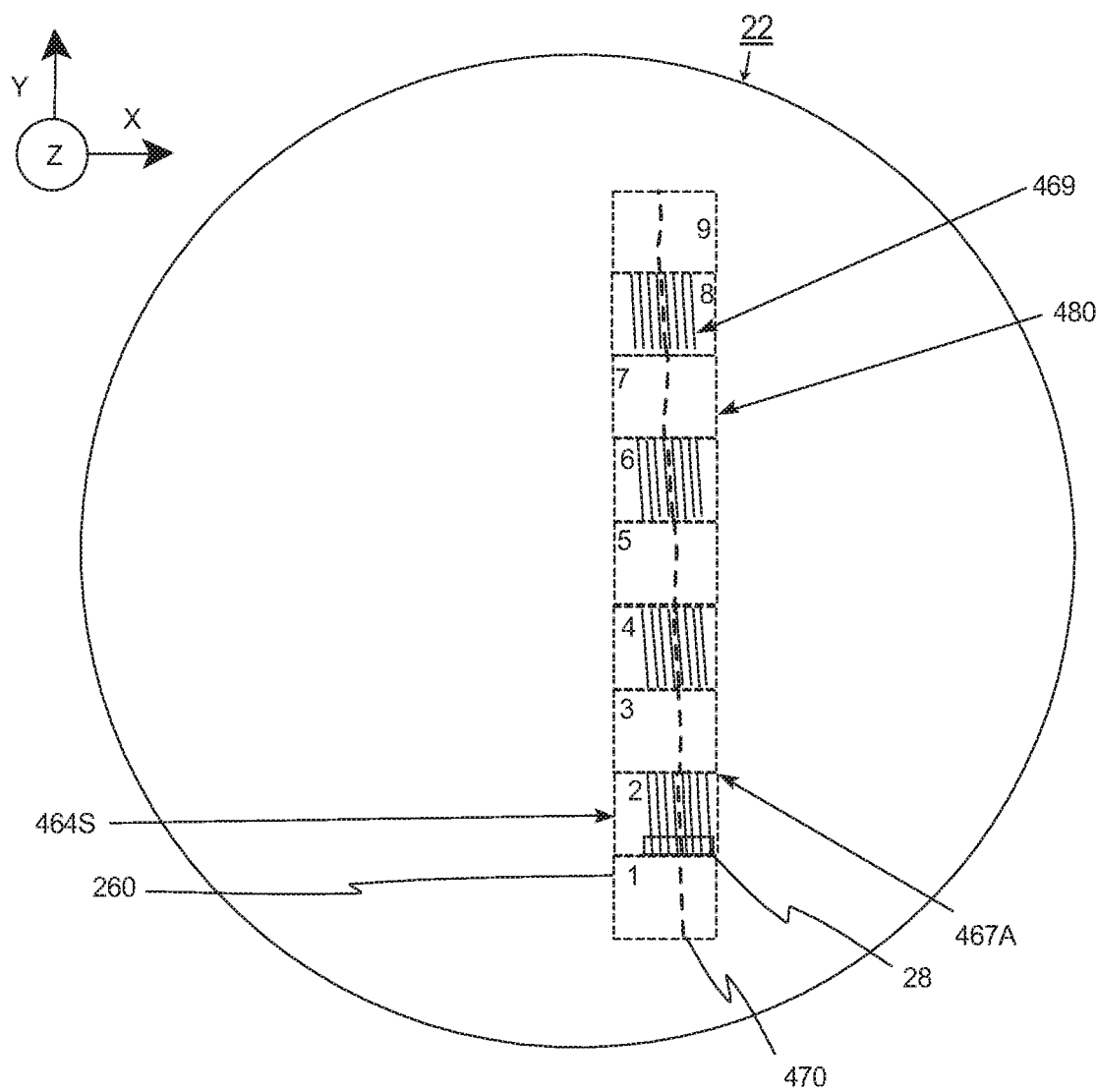
FIG. 4B is a simplified top view of the workpiece with a second portion of the first stripe of parallel lines.

Subsequently, the extreme ultraviolet lithography system 10 is controlled to expose the unexposed dies along the first scan trajectory 466 during a second scan 469. FIG. 4B is a simplified illustration of the workpiece 22 that illustrates the second scan 469 of the workpiece 22 along a second first scan trajectory 470 past the exposure field 28. In this embodiment, the extreme ultraviolet lithography system 10 (illustrated in FIG. 1A) is again controlled so that every other die 260 (illustrated as dashed rectangles) in the die column 480 along the second scan trajectory 470 is not exposed during the second scan 469.

In this example, the extreme ultraviolet lithography system 10 is controlled so that every even numbered die 260 (e.g. dies 2, 4, 6, 8) is exposed during the second scan 469 along the second scan trajectory 470 to create a second portion 464S of the first stripe, and every odd numbered die 260 (e.g. dies 1, 3, 5, 7, 9) is not exposed during the second scan 469. With this design, the stage assembly 20 can be controlled during the second scan 469 to better match the second portion 464S to the existing pattern 233 at the boundaries 467A of the even numbered dies 260. Basically, during the second scan 469, the area of the odd numbered dies 260 provide time to move the workpiece 22 to the proper relative position for printing of the next even numbered die 260. Thus, in the second pass over the same area, the even dies 260 are exposed using a smoothing interpolation while passing over the odd dies 260 which have already been exposed.

It should be noted that the previously printed first portion 464F is not shown in FIG. 4B for clarity. However, with reference to FIGS. 4A and 4B, the first portion 464F and the second portion 464S cooperate to form a complete first stripe of generally parallel lines. It should also be noted that the scan trajectories 466, 470 are partly overlapping but are not exactly the same. With this design, the workpiece 22 must be scanned by the exposure field 28 two times to fully create the new pattern.

In certain embodiment, the shutter assembly 26 (illustrated in FIG. 1A) can be used to precisely start and stop exposure at the boundaries 467A of the dies 260. In this embodiment, the shutter 26C is used to selectively define the Y axis edges of the exposure field 28. With this design, the shutter 26C can be used to open and close in conjunction with scanning. More specifically, the shutter 26C can be controlled to gradually close as the boundary 467A is being approached and close fully at the boundary 467A. Subsequently, the shutter 26C can be controlled to gradually open at the start of the next die 260. Alternatively, for example, the EUV illumination source 34 can be turned on and off as necessary to start and stop exposure.

With this design, the problem of distortion matching a continuous-scanning exposure to layers printed with conventional tools which create discontinuities between adjacent shots is solved by scanning every stripe on the workpiece twice, exposing every other shot in the first pass, and the alternate shots in the second pass.

Figure 4C:
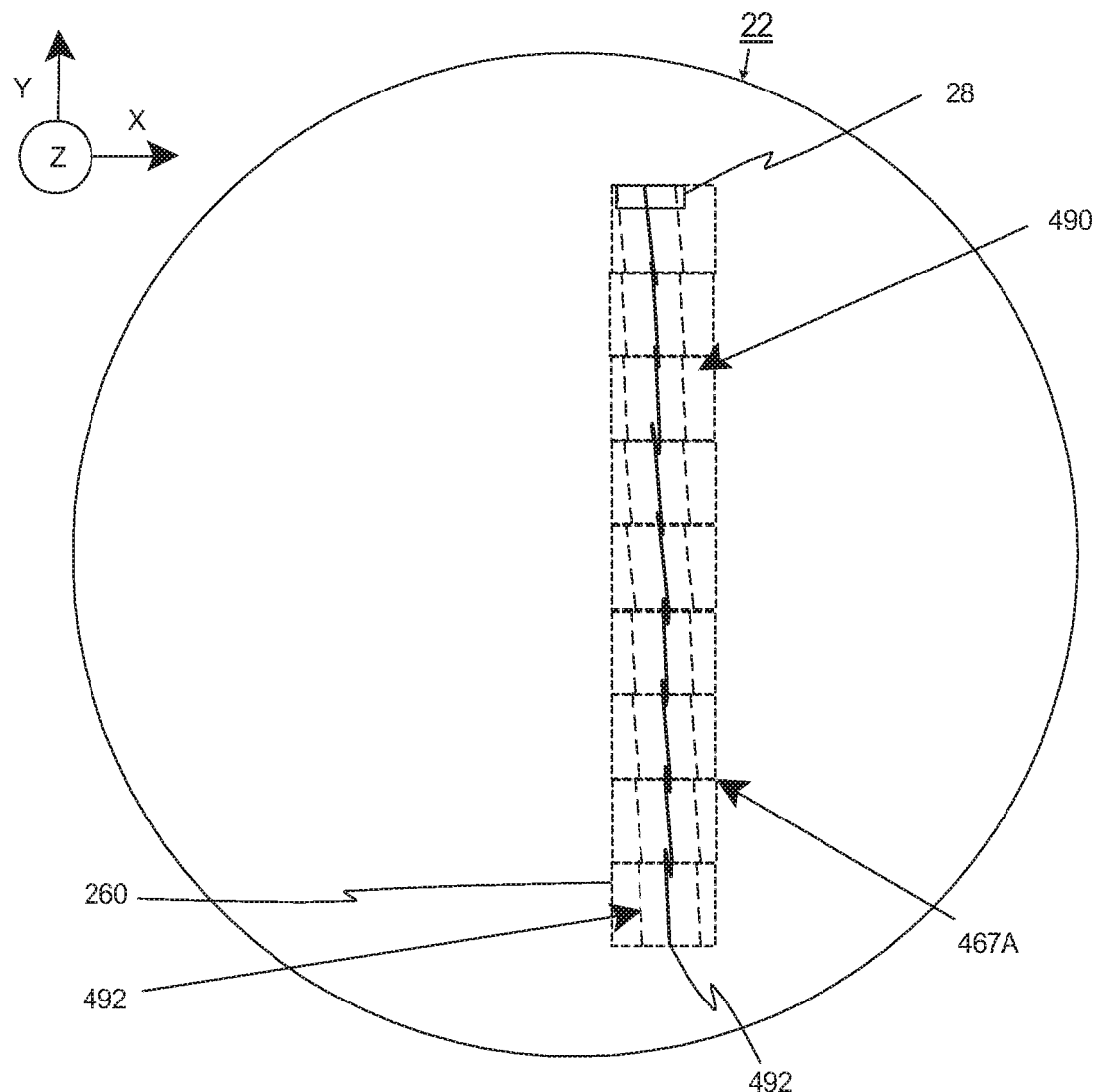
FIG. 4C is a simplified top view of the workpiece and yet another first stripe of parallel lines.

In yet another embodiment, with reference to FIG. 4C, if the workpiece 22 is scanned at relatively low scanning velocity relative to the exposure field 28, and the stage assembly 20 (illustrated in FIG. 1A) has high acceleration capabilities, the exposure can be stopped at the boundary 467A of each die 260, and the workpiece 22 can be stopped and backed up. Subsequently, the exposure can be started at the next die 260. With this design, the EUV illumination system 10 illustrated in FIG. 1A is controlled to stop exposure at the interface 467A of adjacent dies 260 and reset the scan trajectory 492. In one embodiment, as the exposure field 28 reaches the interface 467A the shutter 26 begins to close so that the adjacent die 260 is not exposed. Once the shutter is closed and the exposure has stopped, the stage is decelerated and accelerated in the opposite Y direction in a reverse movement. When the stage has reversed it's position enough, it is decelerated again and accelerated in the scanning direction so that it is properly positioned when it again reaches the interface 467A. As the exposure field 28 begins to pass the interface 467A, the EUV illumination system 10 is controlled to resume illumination and the shutter 26 begins to open. Thus, during the scan 490, the scan trajectory 492 (illustrated with a solid thick line) includes reverse movements along the Y axis during exposure of the first stripe 494 (just the outer lines are illustrated with dashed lines).

With this design, the problem of distortion matching a continuous-scanning exposure to layers printed with conventional tools which create discontinuities between adjacent dies 260 is solved by stopping and resetting at each die 260. As a result thereof, the first stripe 494 and subsequent stripes will better overlay the existing pattern 233 at the boundaries 467A.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 5A:
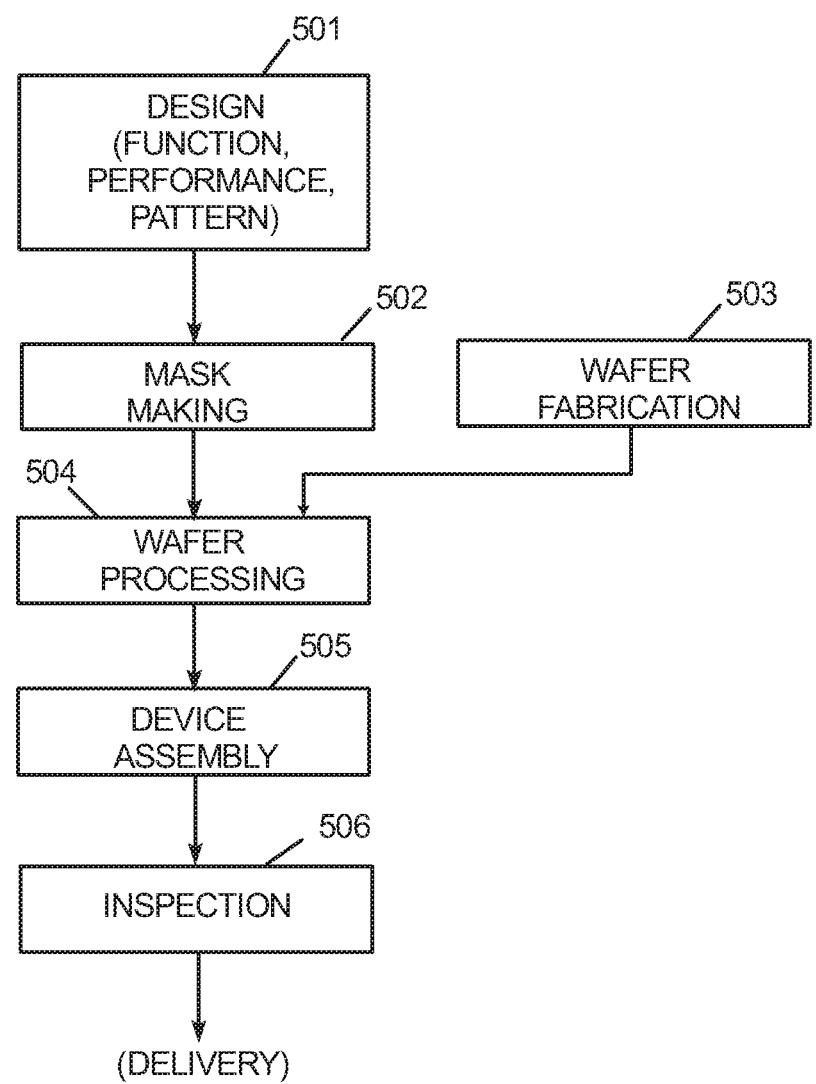
FIG. 5A is a flow chart that outlines a process for manufacturing a device in accordance with the present embodiment.

Further, semiconductor devices can be fabricated using the above described systems, by the process shown generally in FIG. 5A. In step 501 the device's function and performance characteristics are designed. Next, in step 502, a mask (reticle) having a pattern is designed according to the previous designing step, and in a parallel step 503 a workpiece is made from a silicon material. The mask pattern designed in step 502 is exposed onto the workpiece from step 503 in step 504 by a photolithography system described hereinabove in accordance with the present embodiment. In step 505 the semiconductor device is assembled (including the dicing process, bonding process and packaging process), finally, the device is then inspected in step 506.

Figure 5B:
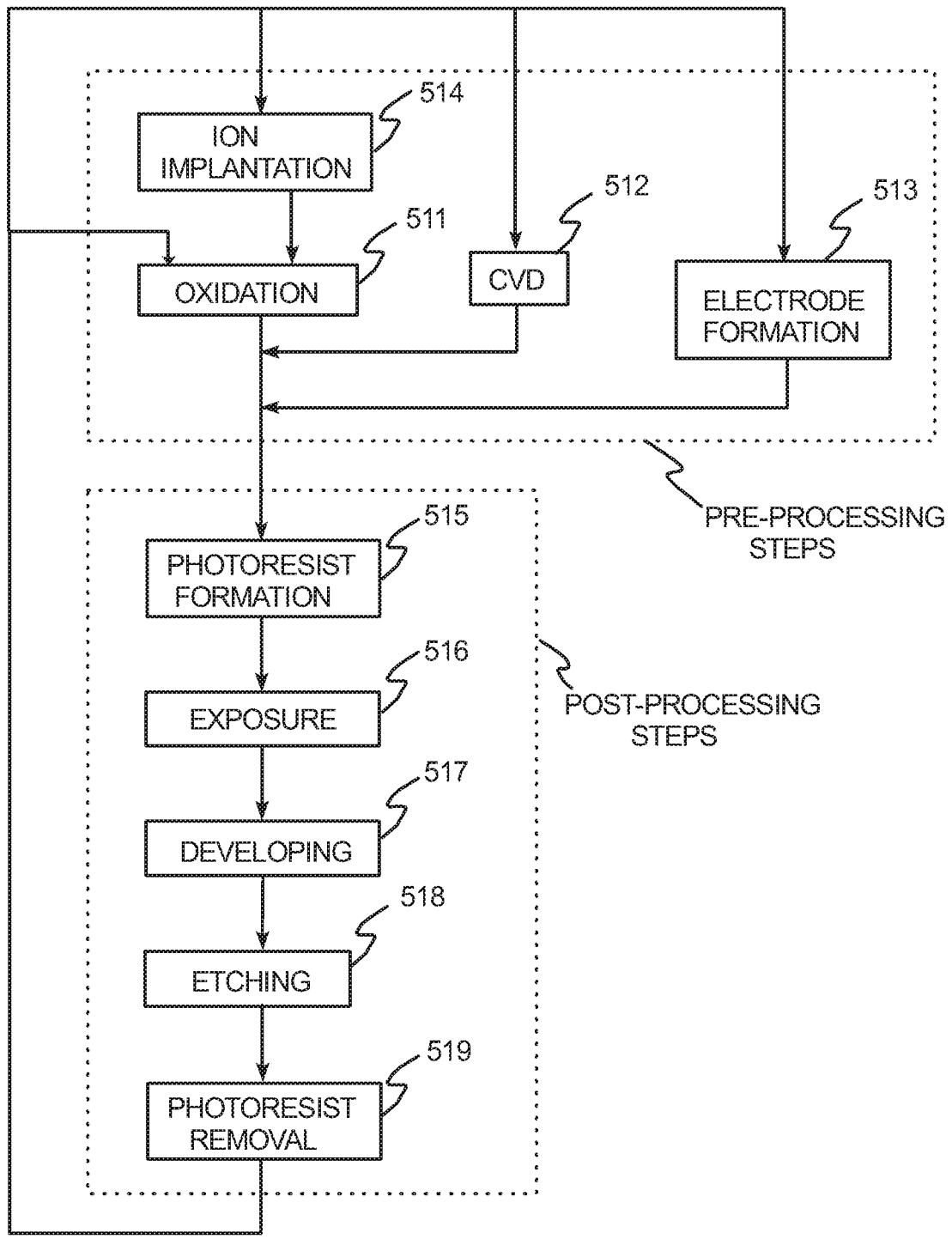
FIG. 5B is a flow chart that outlines device processing in more detail.

FIG. 5B illustrates a detailed flowchart example of the above-mentioned step 504 in the case of fabricating semiconductor devices. In FIG. 5B, in step 511 (oxidation step), the workpiece surface is oxidized. In step 512 (CVD step), an insulation film is formed on the workpiece surface. In step 513 (electrode formation step), electrodes are formed on the workpiece by vapor deposition. In step 514 (ion implantation step), ions are implanted in the workpiece. The above mentioned steps 511-514 form the preprocessing steps for workpieces during workpiece processing, and selection is made at each step according to processing requirements.

At each stage of workpiece processing, when the above-mentioned preprocessing steps have been completed, the following post-processing steps are implemented. During post-processing, first, in step 515 (photoresist formation step), photoresist is applied to a workpiece. Next, in step 516 (exposure step), the above-mentioned exposure device is used to transfer the circuit pattern of a mask (reticle) to a workpiece. Then in step 517 (developing step), the exposed workpiece is developed, and in step 518 (etching step), parts other than residual photoresist (exposed material surface) are removed by etching. In step 519 (photoresist removal step), unnecessary photoresist remaining after etching is removed.

Multiple circuit patterns are formed by repetition of these preprocessing and post-processing steps.

While the assembly as shown and disclosed herein is fully capable of obtaining the objects and providing the advantages herein before stated, it is to be understood that it is merely illustrative of the presently preferred embodiments and that no limitations are intended to the details of construction or design herein shown other than as described in the appended claims.

What is claimed is:

1. An extreme ultraviolet lithography system that transfers a pattern of parallel lines onto a workpiece that includes an existing pattern, the lithography system comprising:

a workpiece stage assembly that retains and moves the workpiece;

an EUV illumination system that directs an extreme ultraviolet beam at a patterning element that defines the pattern of parallel lines;

a projection optical assembly that projects and transfers an image of the the plurality of parallel lines, within an exposure field, onto the workpiece as the workpiece is moved relative to the exposure field during a first scan, the exposure resulting in a first stripe of the imaged plurality of lines extending generally along a first axis; and a control system that controls the workpiece stage assembly to move the workpiece relative to the exposure field along a first scan trajectory that is generally along the first axis during the first scan;

wherein the control system selectively adjusts a control parameter during the first scan of the workpiece stage assembly so that the first stripe of parallel lines becomes distorted so as to overlay and more accurately match a distortion of the portion of existing pattern positioned under the first stripe of parallel lines relative to if the control parameter is not adjusted.

2. The extreme ultraviolet lithography system of claim 1 wherein the control parameter includes selectively adjusting the first scan trajectory to include some movement along a second axis that is orthogonal to the first axis during the first scan so that the first stripe of parallel lines more accurately overlays the portion of existing pattern positioned under the first stripe of parallel lines relative to if the movement along the second axis is not performed.

3. The extreme ultraviolet lithography system of claim 2 wherein the control parameter includes selectively adjusting the first scan trajectory to include some movement about a third axis that is orthogonal to the first and second axes during the first scan so that the first stripe of parallel lines more accurately overlays the portion of existing pattern positioned under the first stripe of parallel lines.

4. The extreme ultraviolet lithography system of claim 3 wherein during the first scan, the movement along the second axis or about the third axis is a function of a workpiece position of the workpiece along the first axis relative to if the movement along the second axis or about the third axis is not performed.

5. The extreme ultraviolet lithography system of claim 1 wherein the control parameter includes selectively adjusting a magnification of the plurality of parallel lines during the first scan so that the first stripe of parallel lines more accurately overlays the portion of existing pattern positioned under the first stripe of parallel lines relative to if the magnification is not adjusted.

6. The extreme ultraviolet lithography system of claim 1 wherein the control parameter includes selectively adjusting a magnification tilt of the plurality of parallel lines during the first scan so that the first stripe of parallel lines more accurately overlays the portion of existing pattern positioned under the first stripe of parallel lines.

7. The extreme ultraviolet lithography system of claim 1 wherein the control parameter includes selectively adjusting one or more of (i) the first scan trajectory to include some movement along a second axis that is orthogonal to the first axis, and some movement about a third axis that is orthogonal to the first and second axes during the first scan; (ii) a magnification of the patterning element pattern during the first scan; and (iii) a magnification tilt of the patterning element pattern during the first scan.

8. An extreme ultraviolet lithography system that transfers a pattern of parallel lines onto a workpiece that includes an existing pattern, the existing pattern including a plurality of dies, the lithography system comprising:
a workpiece stage assembly that retains and moves the workpiece;
an EUV illumination system that directs an extreme ultraviolet beam at a patterning element that defines the pattern of parallel lines;
a projection optical assembly that projects and transfers an image of the plurality of parallel lines, within an exposure field, onto the workpiece as the workpiece is moved relative to the exposure field during a first scan, the exposure resulting in a first stripe of the imaged plurality of lines extending generally along a first axis; and
a control system that controls the workpiece stage assembly to move the workpiece relative to the exposure field along a first scan trajectory that is generally along the first axis during the first scan;
wherein the control system selectively adjusts a control parameter during the first scan of the workpiece stage assembly so that the first stripe of parallel lines overlays and more accurately matches the portion of existing pattern positioned under the first stripe of parallel lines relative to if the control parameter is not adjusted; and
wherein the control system controls the EUV illumination system so that every other die along the first scan trajectory is not exposed during the first scan.

9. The extreme ultraviolet lithography system of claim 8 wherein the control system controls the EUV illumination system to expose the unexposed dies along the first scan trajectory during a second scan.

10. The extreme ultraviolet lithography system of claim 1 wherein the existing pattern includes a plurality of dies, wherein the control system stops exposure at an interface of adjacent dies; and wherein the control system controls the workpiece stage assembly to move the stage in a manner that resets the first scan trajectory so that the new pattern overlays the existing pattern during exposure of the subsequent die.

11. The extreme ultraviolet lithography system of claim 10 wherein the EUV illumination is stopped by a shutter assembly located at or near a plane that is optically conjugate to the workpiece.

12. The extreme ultraviolet lithography system of claim 10 wherein the workpiece stage assembly resets the first scan trajectory by:
decelerating the stage to stop the scanning motion;
accelerating the stage in the opposite direction;
decelerating the stage to stop the reverse motion;
accelerating the stage to resume scanning.

13. The extreme ultraviolet lithography system of claim 1 wherein the control system selectively adjusts the first scan trajectory and a pitch of the parallel lines transferred to the workpiece during the first scan so that the first stripe of parallel lines are distorted to overlay the portion of existing pattern positioned under the first stripe of parallel lines.

14. A method for transferring a pattern having a plurality of parallel lines onto a workpiece that includes an existing pattern that is distorted comprising:
providing a patterning element having a patterning element pattern;
moving the workpiece with a workpiece stage mover assembly;
directing an extreme ultraviolet beam at the patterning element with an EUV illumination system;
imaging the patterning element pattern onto the workpiece using a projection optical assembly, thereby creating the plurality of parallel lines on the workpiece when the workpiece is moved relative to the exposure field during a first scan, a first stripe of parallel lines extending generally along a first axis; and
controlling the workpiece stage assembly with a control system to move the workpiece relative to the exposure field along a first scan trajectory that is generally along the first axis during the first scan;
wherein the control system selectively adjusts a control parameter during the first scan so that the first stripe of parallel lines becomes distorted so as to overlay and match the distortion of the portion of existing pattern positioned under the first stripe of parallel lines more accurately than if the control parameter were not adjusted.

15. The method of claim 14 wherein the step of controlling includes controlling the workpiece stage assembly so that the first scan trajectory includes some movement along a second axis that is orthogonal to the first axis during the first scan so that the first stripe of parallel lines more accurately overlays the portion of existing pattern positioned under the first stripe of parallel lines.

16. The method of claim 15 wherein the step of controlling includes controlling the workpiece stage assembly so that the first scan trajectory includes some movement about a third axis that is orthogonal to the first and second axes during the first scan so that the first stripe of parallel lines more accurately overlays the portion of existing pattern positioned under the first stripe of parallel lines.

17. The method of claim 16 wherein the control parameter includes selectively adjusting a magnification of the patterning element pattern during the first scan so that the first stripe of parallel lines more accurately overlays the portion of existing pattern positioned under the first stripe of parallel lines.

18. The method of claim 14 wherein the control parameter includes selectively adjusting a magnification tilt of the patterning element pattern during the first scan so that the first stripe of parallel lines more accurately overlays the portion of existing pattern positioned under the first stripe of parallel lines.

19. The method of claim 14 wherein controlling includes selectively adjusting at least one of (i) the first scan trajectory to include some movement along a second axis that is orthogonal to the first axis, and/or some movement about a third axis that is orthogonal to the first and second axes during the first scan; (ii) a magnification of the patterning element pattern during the first scan; and (iii) a magnification tilt of the patterning element pattern during the first scan.

20. The method of claim 14 wherein the existing pattern includes a plurality of dies, and wherein controlling includes controlling the EUV illumination system so that every other die along the first scan trajectory is not exposed during the first scan.

21. The method of claim 20 further comprising controlling the EUV illumination system to expose the unexposed dies along the first scan trajectory during a second scan.

22. The method of claim 14 wherein the existing pattern includes a plurality of dies, and wherein the method includes controlling the EUV illumination system with the control system to stop at an interface of adjacent dies and reset the first scan trajectory.

23. The method of claim 14 including selectively adjusting the first scan trajectory and a pitch of the parallel lines transferred to the workpiece during the first scan with the control system so that the first stripe of parallel lines are distorted to overlay the portion of existing pattern positioned under the first stripe of parallel lines.

* * * * *